United States Patent
Noemaun et al.

(10) Patent No.: US 11,600,707 B2
(45) Date of Patent: Mar. 7, 2023

(54) METHODS OF FORMING CONDUCTIVE PIPES BETWEEN NEIGHBORING FEATURES, AND INTEGRATED ASSEMBLIES HAVING CONDUCTIVE PIPES BETWEEN NEIGHBORING FEATURES

(71) Applicant: Micron Technology, Inc., Boise, ID (US)

(72) Inventors: Ahmed Nayaz Noemaun, Boise, ID (US); Stephen W. Russell, Boise, ID (US); Tao D. Nguyen, Boise, ID (US); Santanu Sarkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 15/930,090

(22) Filed: May 12, 2020

(65) Prior Publication Data
US 2021/0359089 A1 Nov. 18, 2021

(51) Int. Cl.
*H01L 29/40* (2006.01)
*H01L 29/66* (2006.01)
*H01L 21/82* (2006.01)

(52) U.S. Cl.
CPC ............ *H01L 29/408* (2013.01); *H01L 21/82* (2013.01); *H01L 29/6656* (2013.01)

(58) Field of Classification Search
CPC ........... H01L 27/10826; H01L 27/1211; H01L 21/823431; H01L 21/823821; H01L 21/823475; H01L 21/823871; H01L 21/76895; H01L 23/50; H01L 23/5286
See application file for complete search history.

(56) References Cited

U.S. PATENT DOCUMENTS

| | | | | |
|---|---|---|---|---|
| 7,939,409 B2* | 5/2011 | Figura | ............... | H01L 27/10897 438/259 |
| 8,362,537 B2* | 1/2013 | Kunkel | ............. | H01L 27/10823 257/296 |
| 9,466,713 B2* | 10/2016 | Lee | ......................... | H01L 21/266 |
| 2007/0082437 A1* | 4/2007 | Cheng | ................... | H01L 29/785 438/197 |
| 2009/0090993 A1* | 4/2009 | Henson | ............... | H01L 23/5256 257/529 |

(Continued)

FOREIGN PATENT DOCUMENTS

| | | |
|---|---|---|
| KR | 10-0248356 | 5/2000 |
| KR | 10-0680939 | 2/2007 |

(Continued)

OTHER PUBLICATIONS

Prasad, et al., "Buried Power Rails and Back-side Power Grids: ARM CPU Power Delivery Network Design Beyond 5nm", IEEE, 2019, United States, pp. 19.1.1-19.1.4.

*Primary Examiner* — Vincent Wall
(74) *Attorney, Agent, or Firm* — Wells St. John P.S.

(57) ABSTRACT

Some embodiments include an integrated assembly having a pair of substantially parallel features spaced from one another by an intervening space. A conductive pipe is between the features and substantially parallel to the features. The conductive pipe may be formed within a tube. The tube may be generated by depositing insulative material between the features in a manner which pinches off a top region of the insulative material to leave the tube as a void region under the pinched-off top region.

56 Claims, 20 Drawing Sheets

(56) References Cited

U.S. PATENT DOCUMENTS

| | | | |
|---|---|---|---|
| 2010/0090264 A1* | 4/2010 | Moll | H01L 27/10885 |
| | | | 257/301 |
| 2011/0140235 A1* | 6/2011 | Oda | H01L 23/5256 |
| | | | 257/E23.149 |
| 2015/0129931 A1 | 5/2015 | Ji | |
| 2016/0343708 A1* | 11/2016 | Park | H01L 29/41791 |
| 2016/0358856 A1* | 12/2016 | Kim | H01L 23/5286 |
| 2017/0243821 A1 | 8/2017 | Bergendahl | |
| 2018/0053694 A1 | 2/2018 | Cheng | |
| 2019/0080969 A1* | 3/2019 | Tsao | H01L 21/823418 |
| 2019/0165177 A1* | 5/2019 | Chen | H01L 21/823431 |
| 2019/0165178 A1* | 5/2019 | Chen | H01L 23/481 |
| 2020/0020795 A1 | 1/2020 | Bao | |
| 2020/0098681 A1* | 3/2020 | Kim | H01L 27/0924 |
| 2020/0105891 A1* | 4/2020 | Lilak | H01L 29/517 |
| 2020/0135724 A1* | 4/2020 | Lin | H01L 29/41791 |

FOREIGN PATENT DOCUMENTS

| | | |
|---|---|---|
| TW | 110111261 | 3/2022 |
| WO | WO PCT/US2021/022056 | 7/2021 |

\* cited by examiner

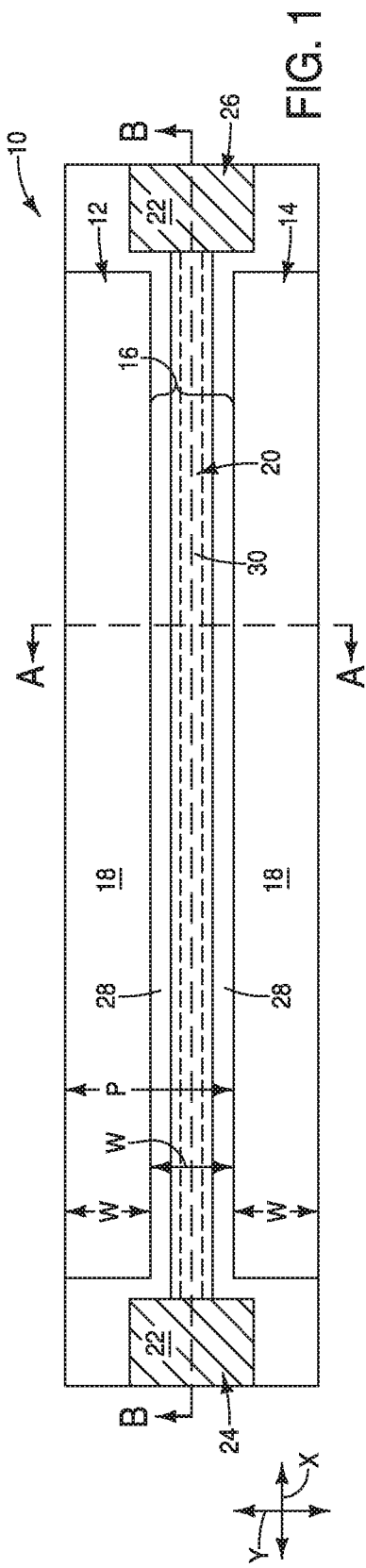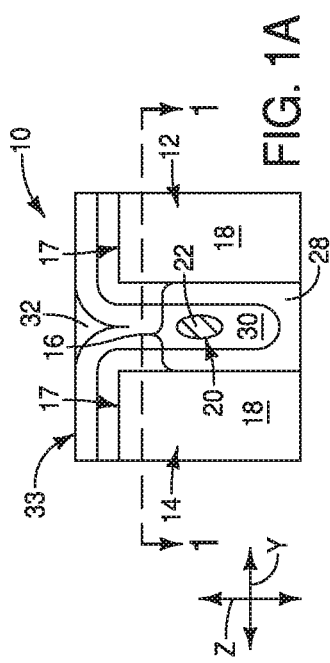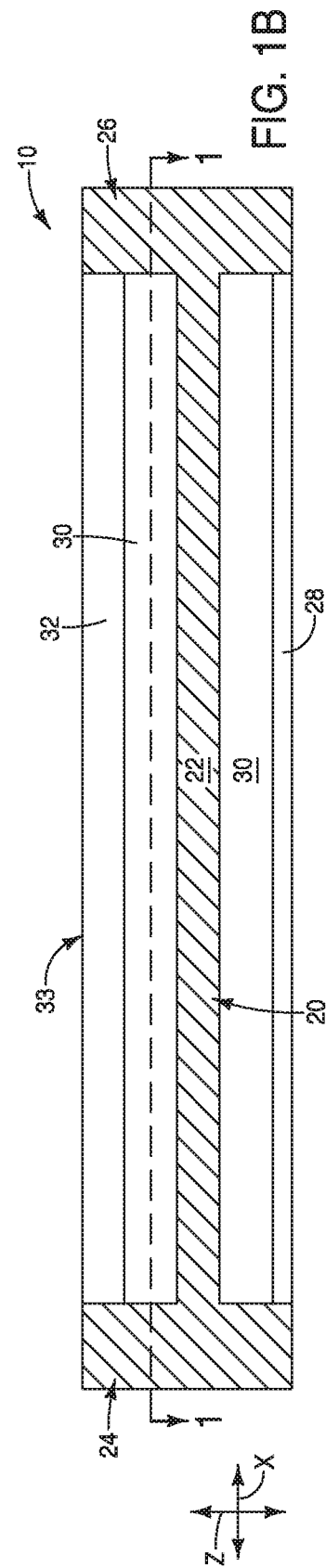

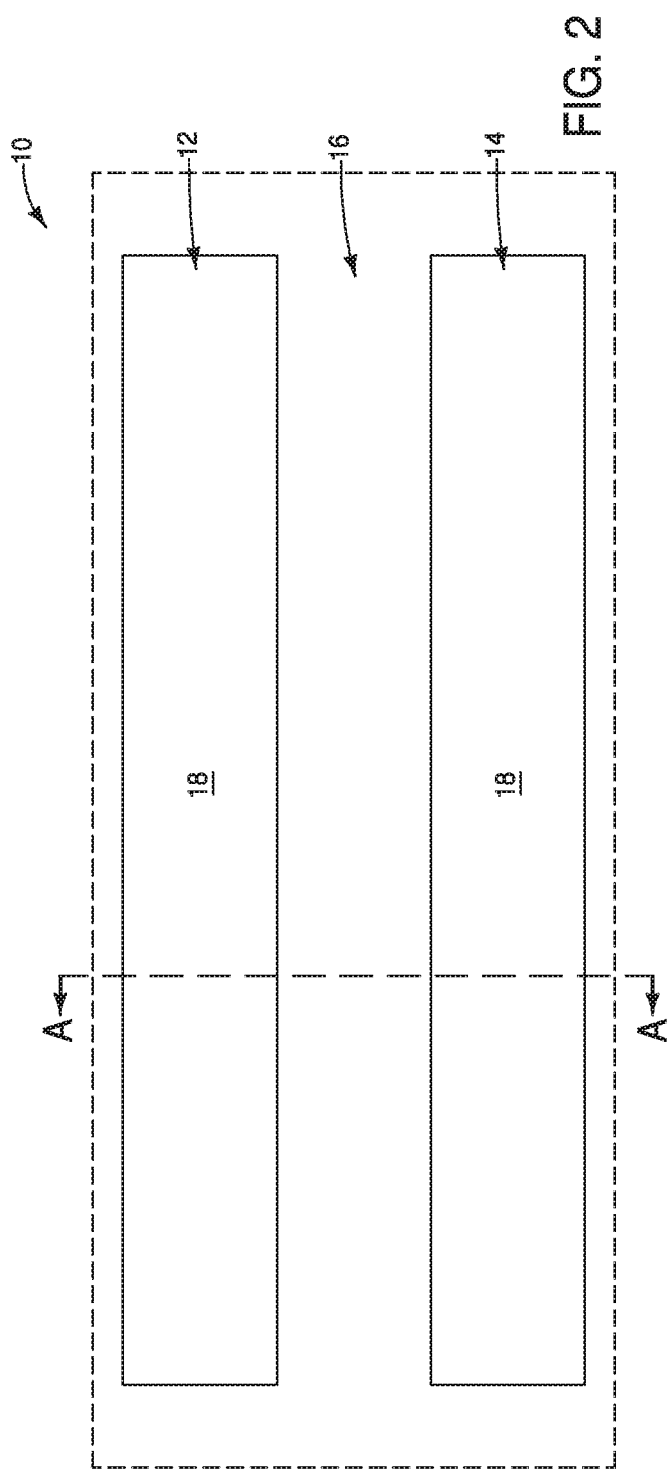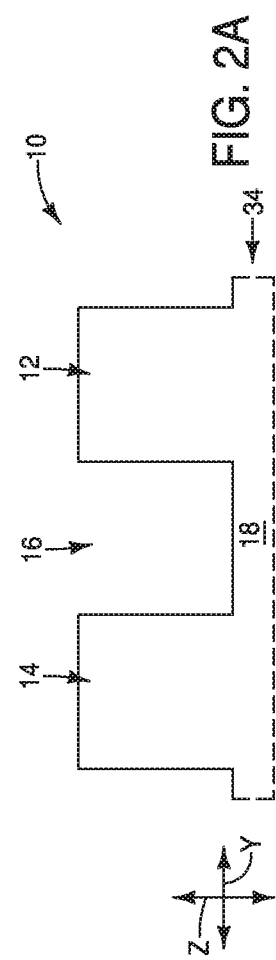

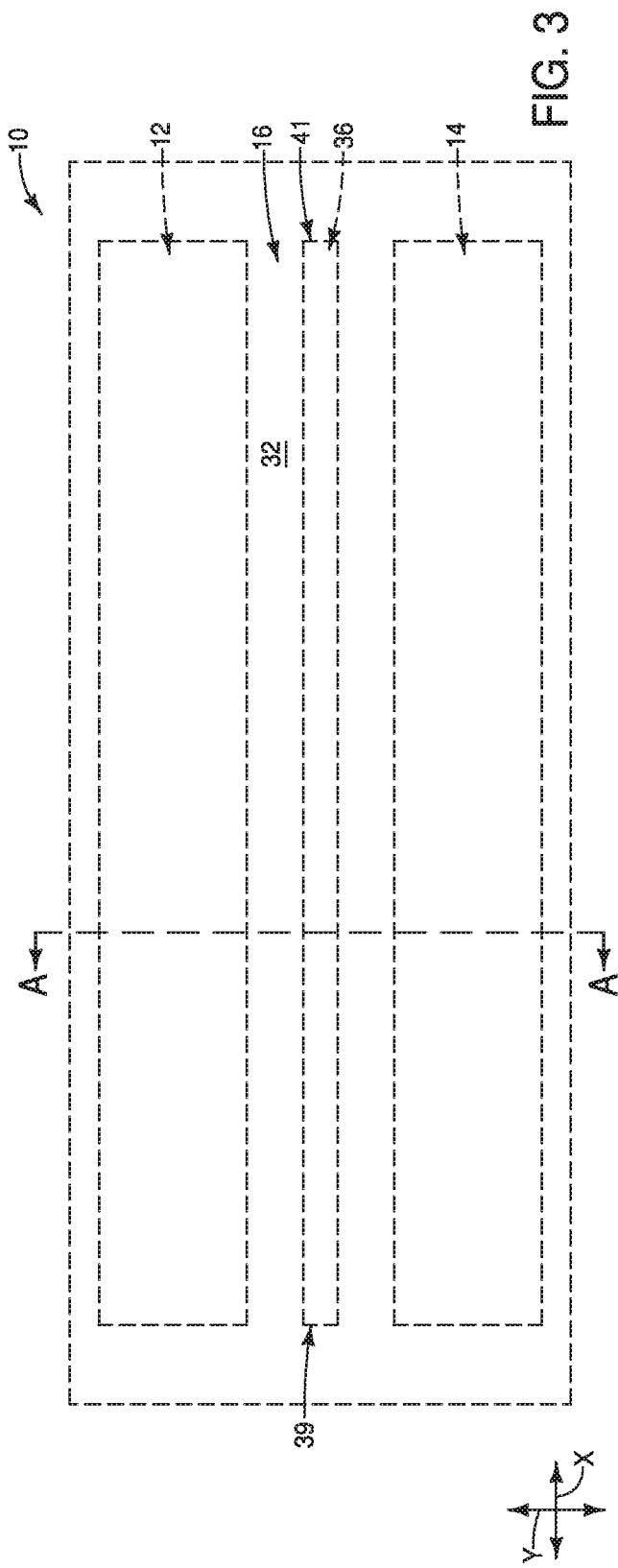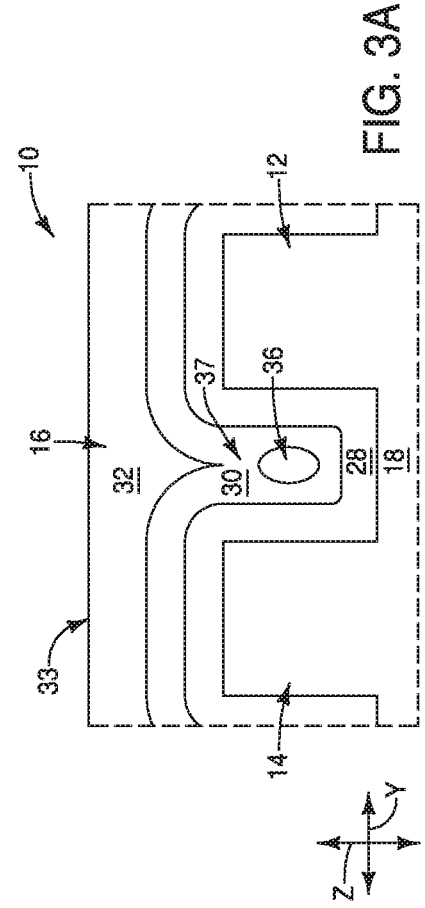

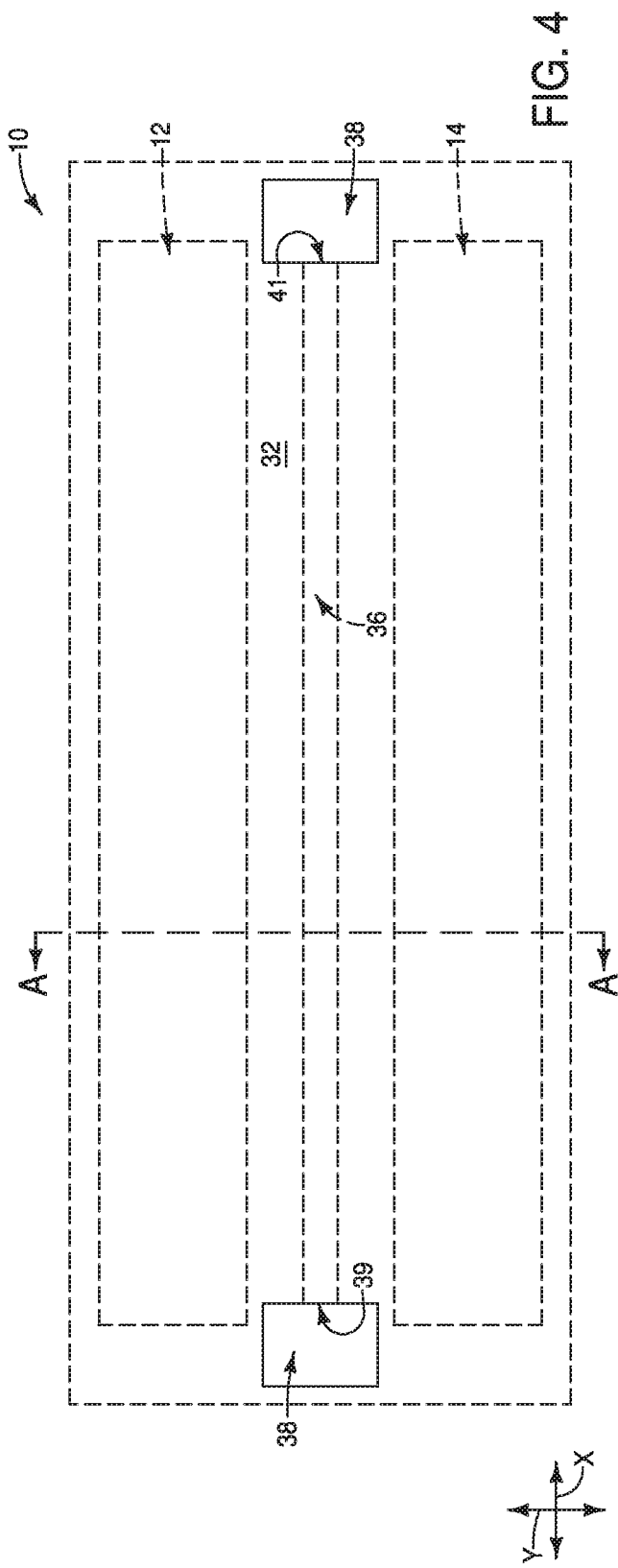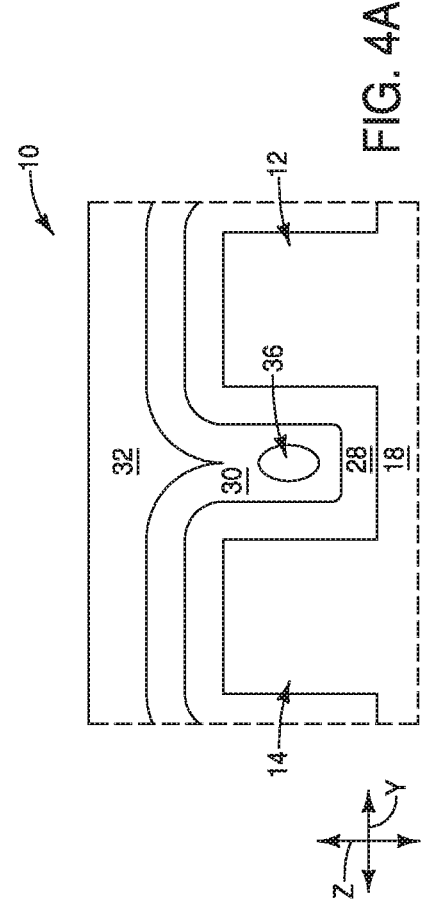

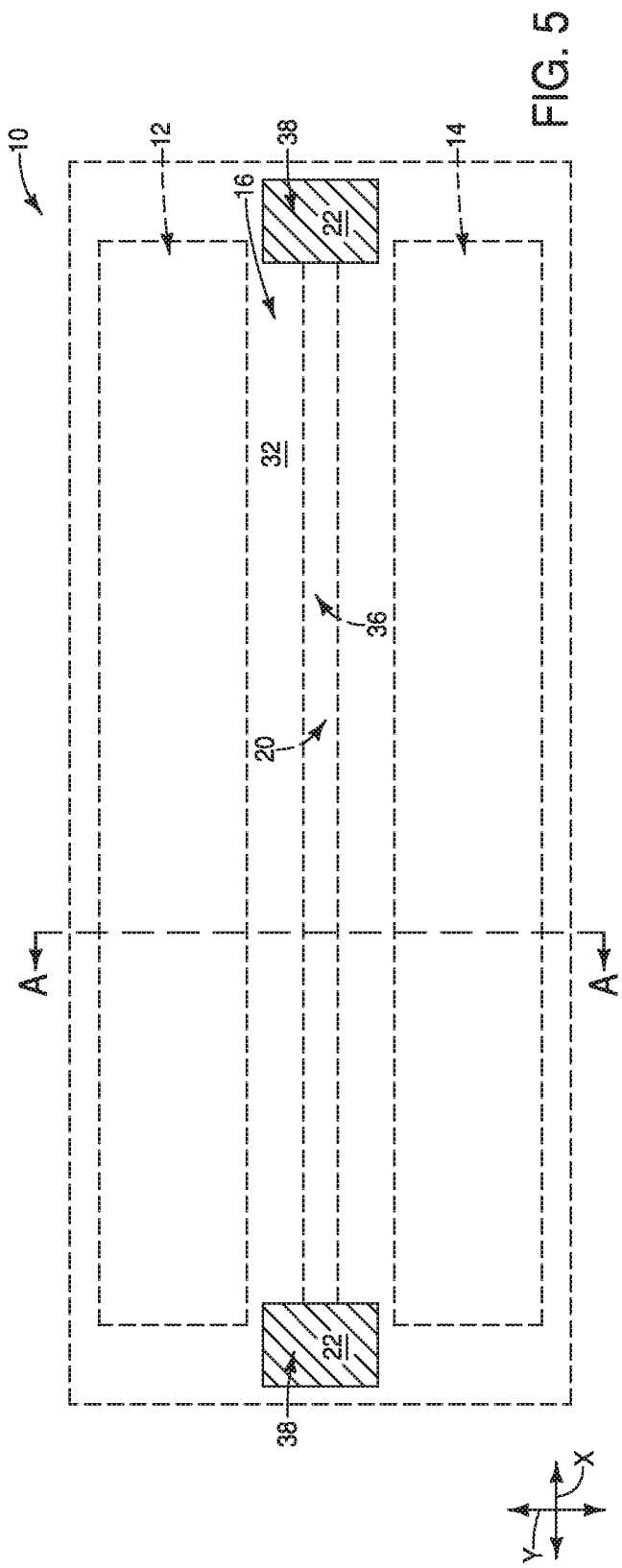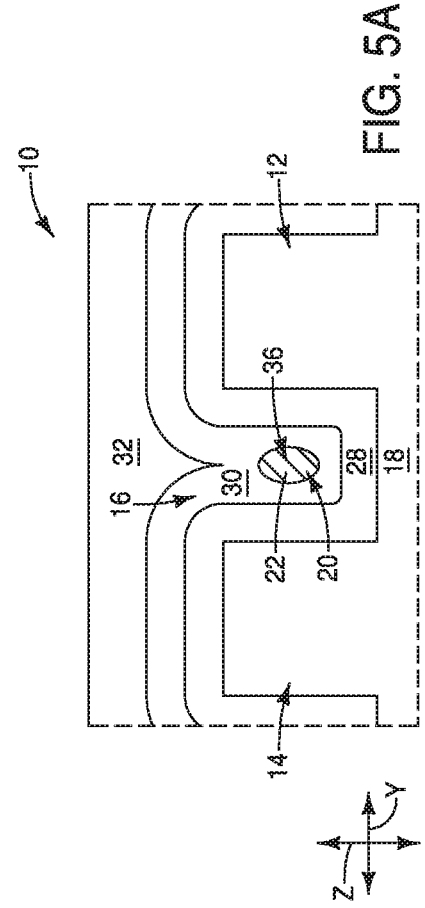

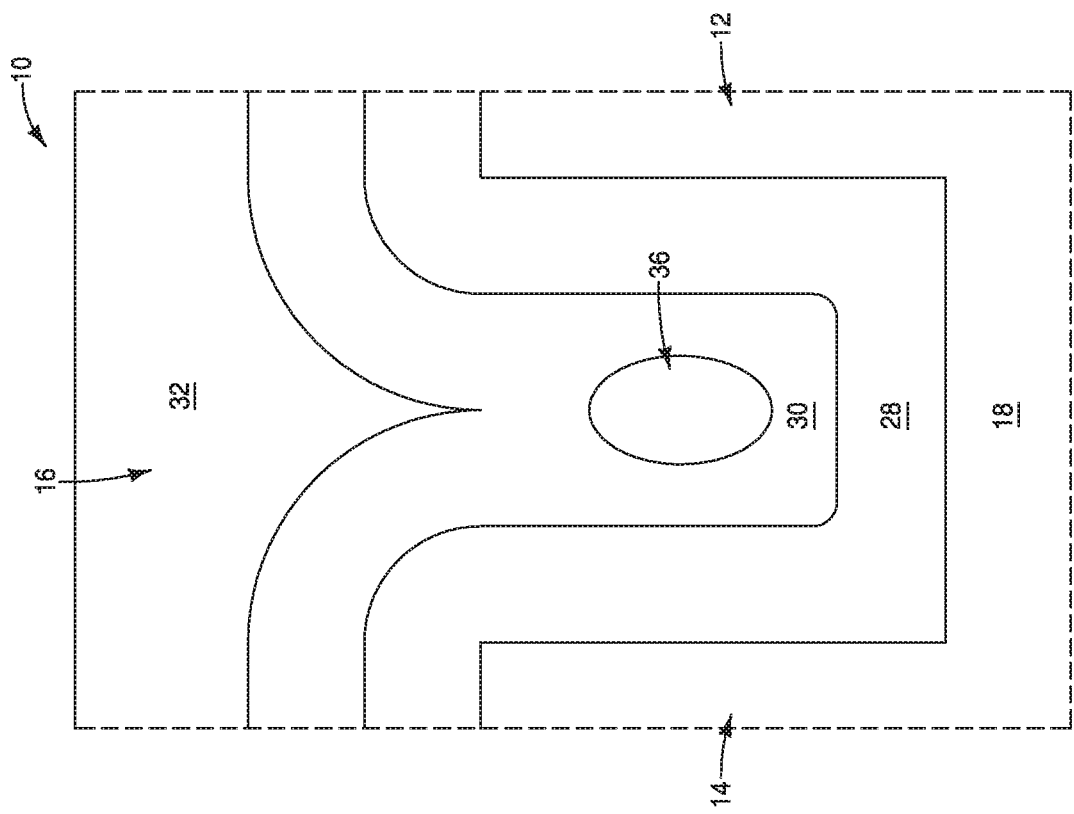
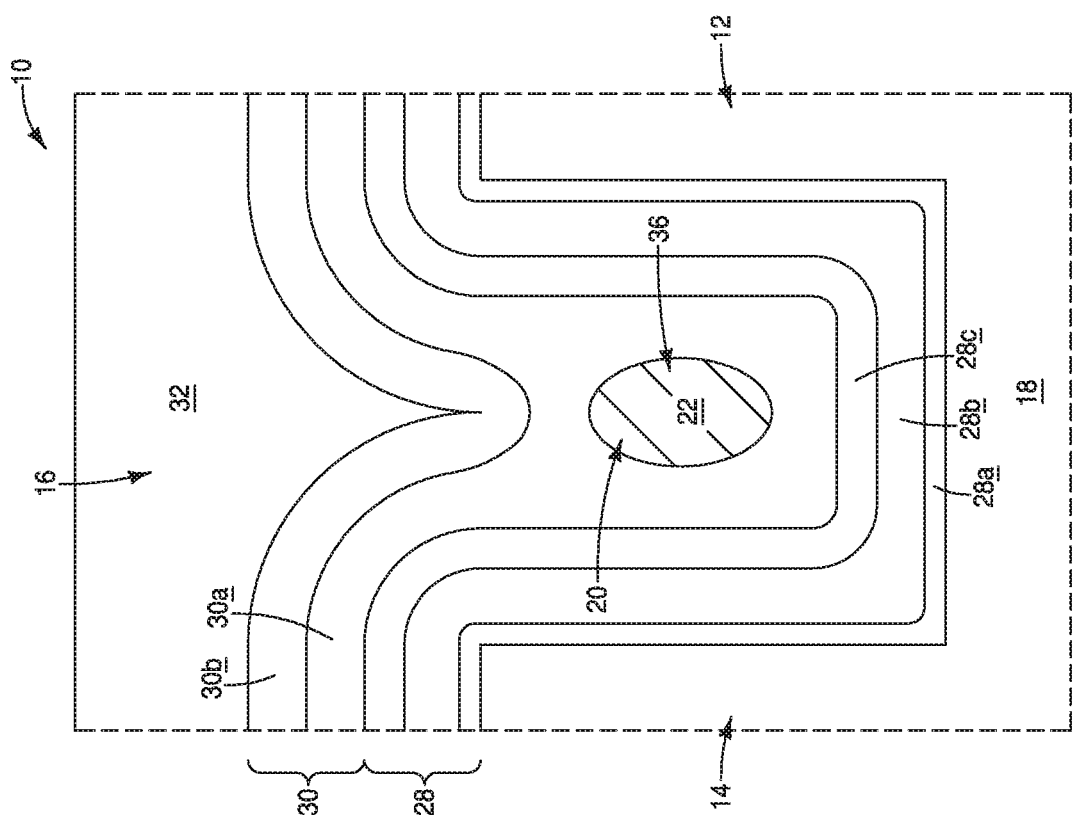

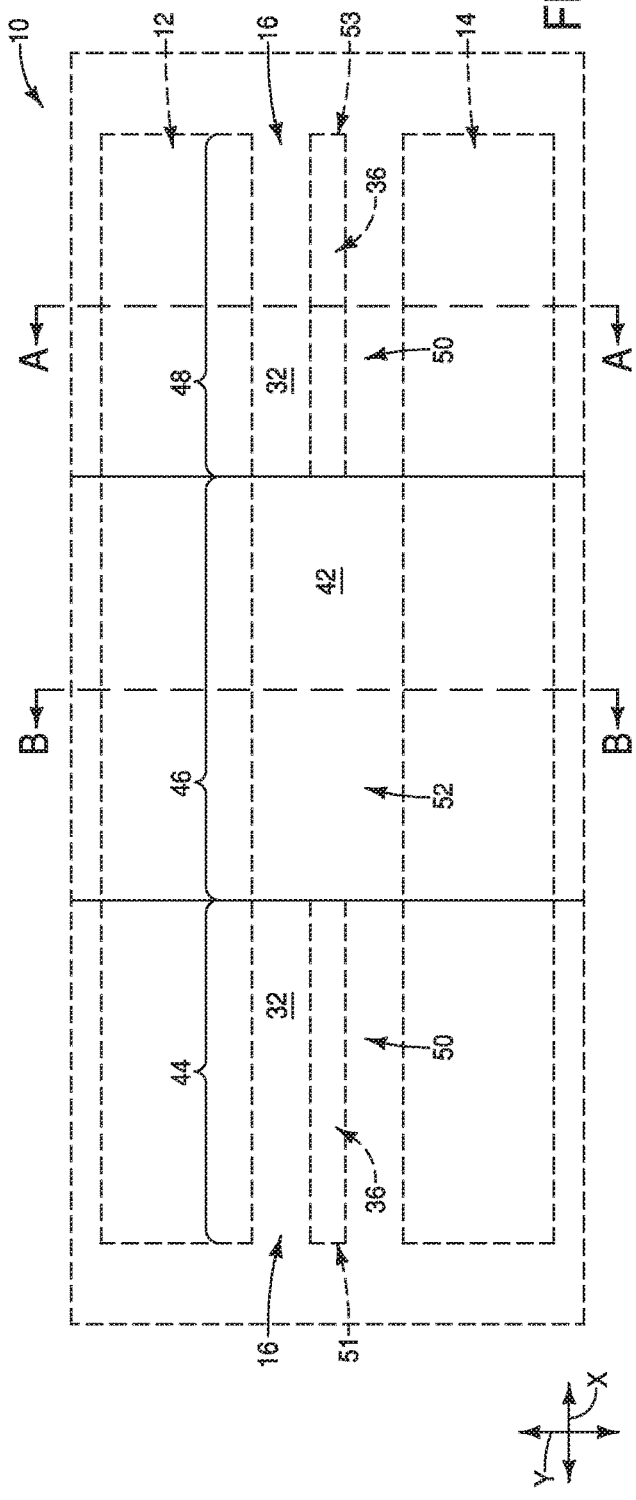
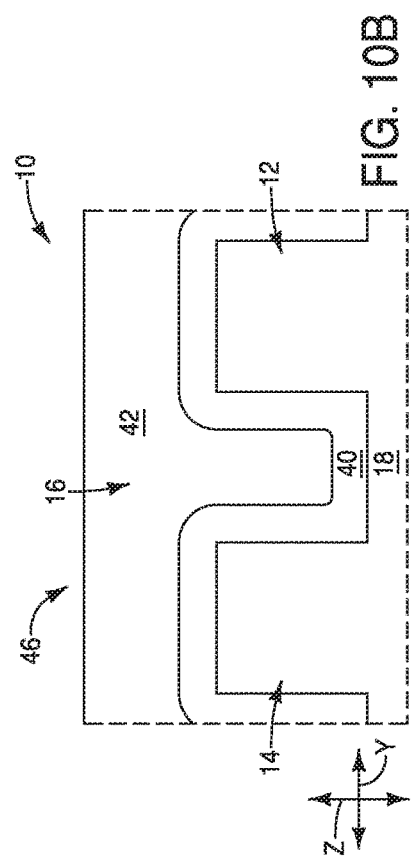
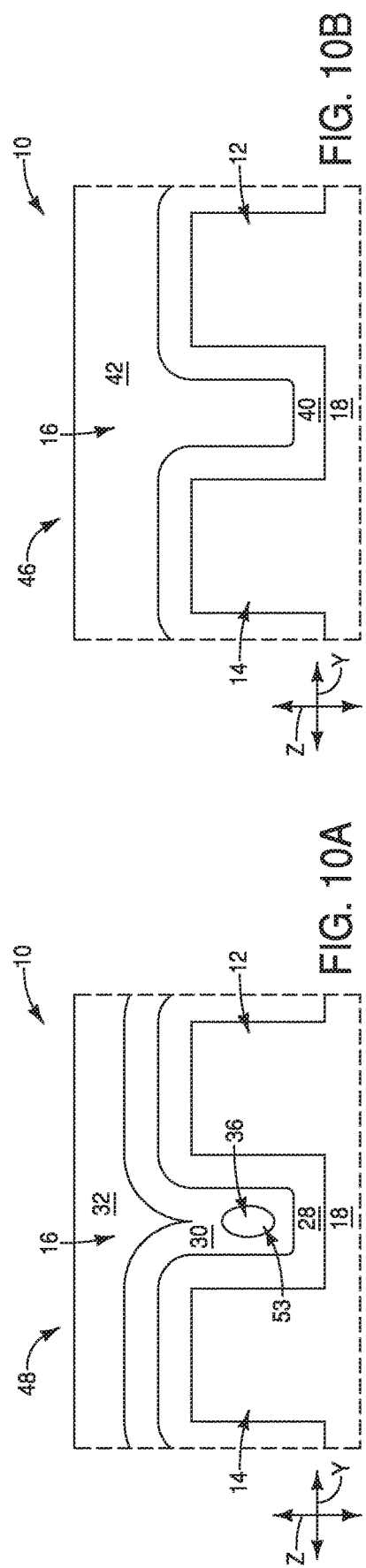

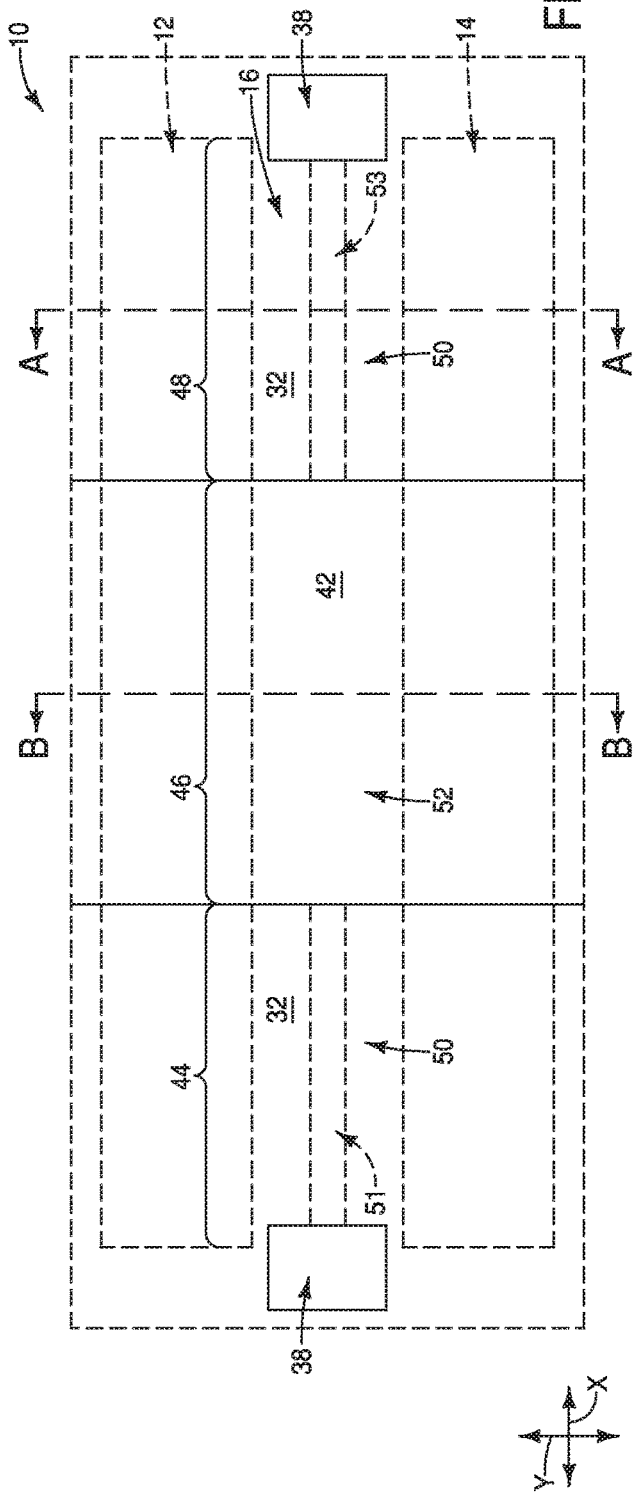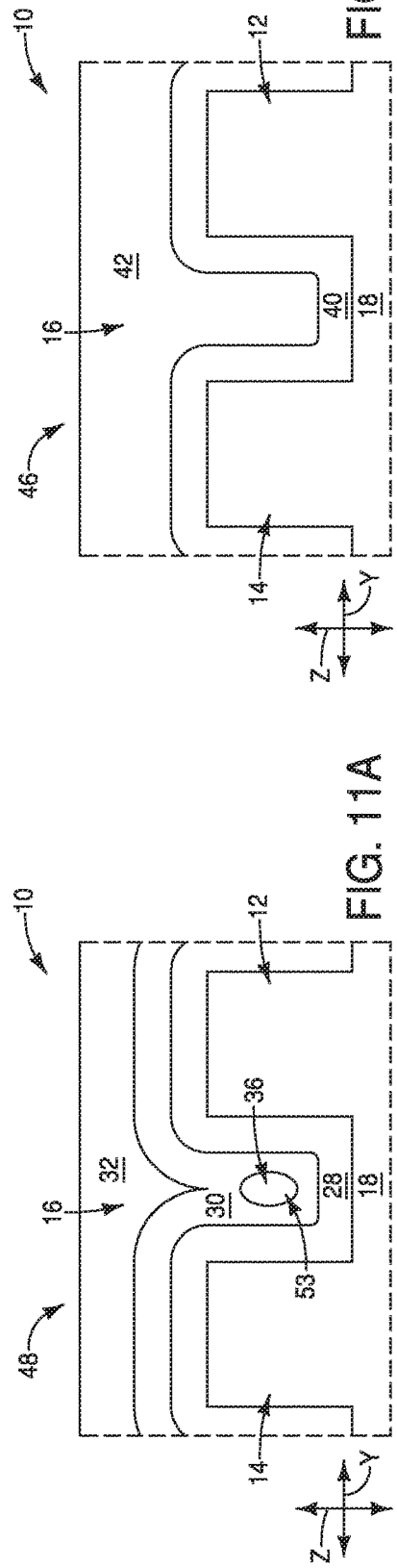

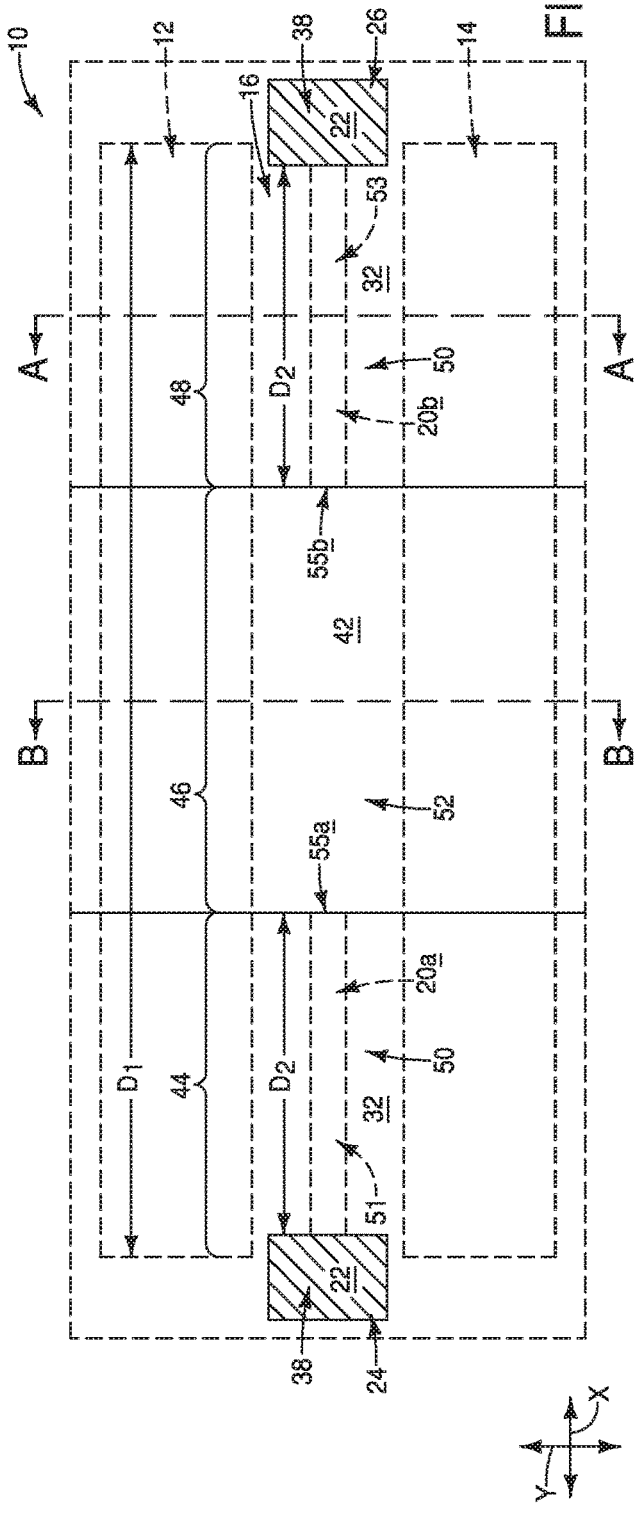
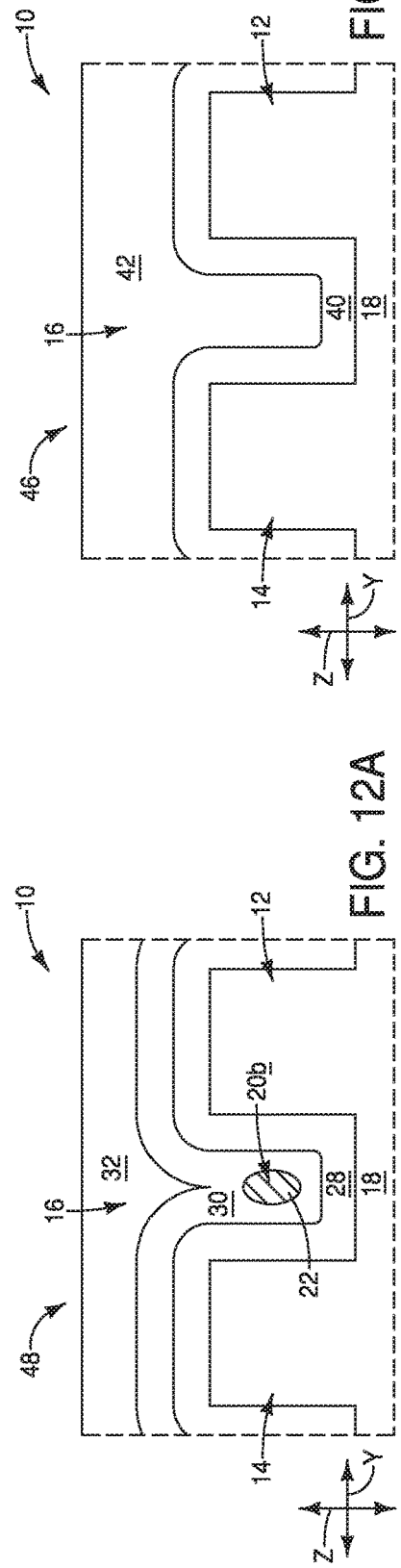

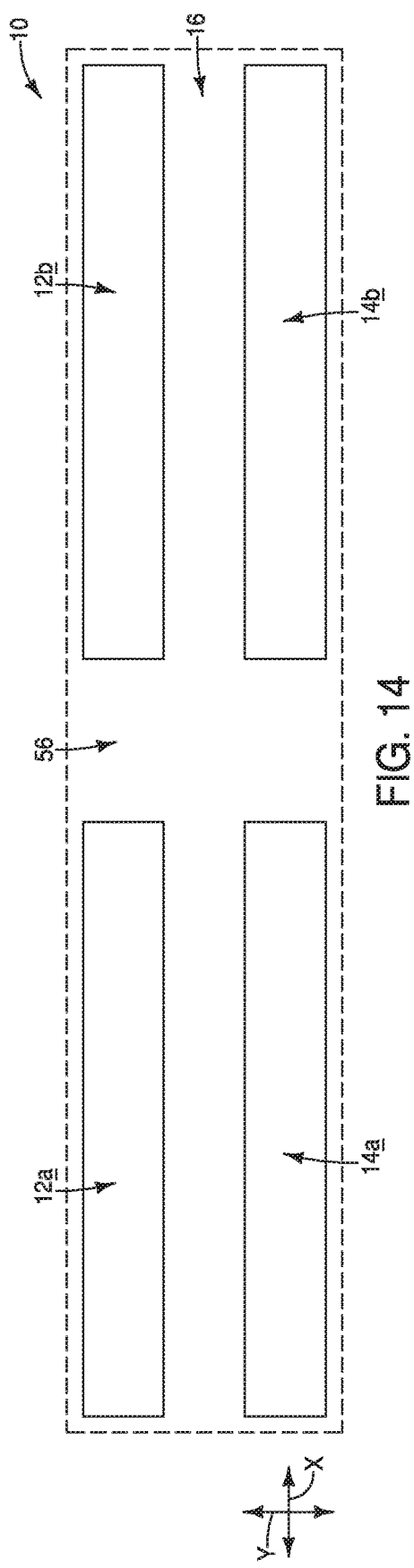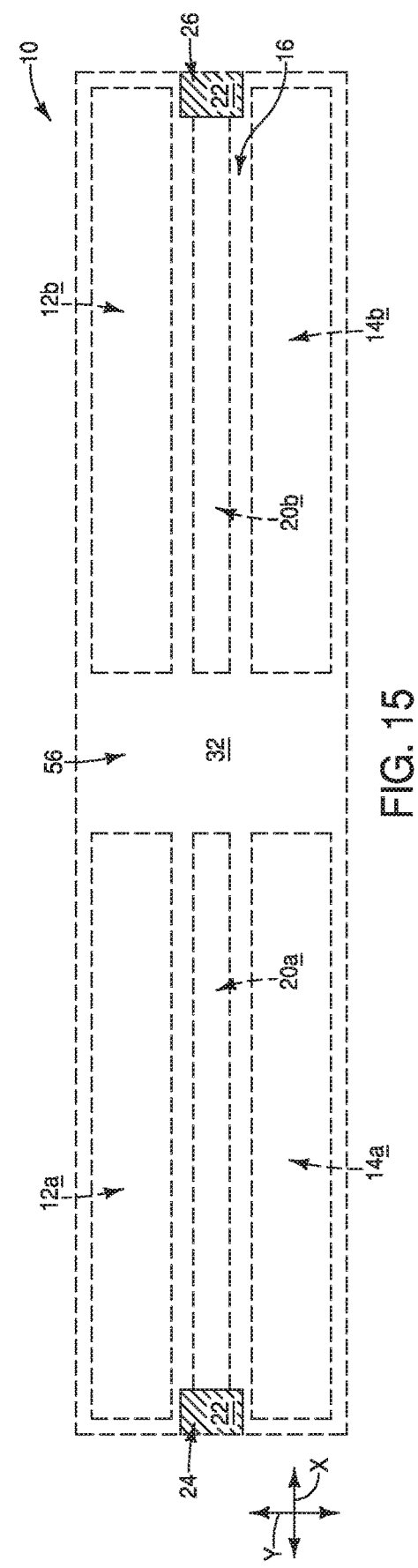

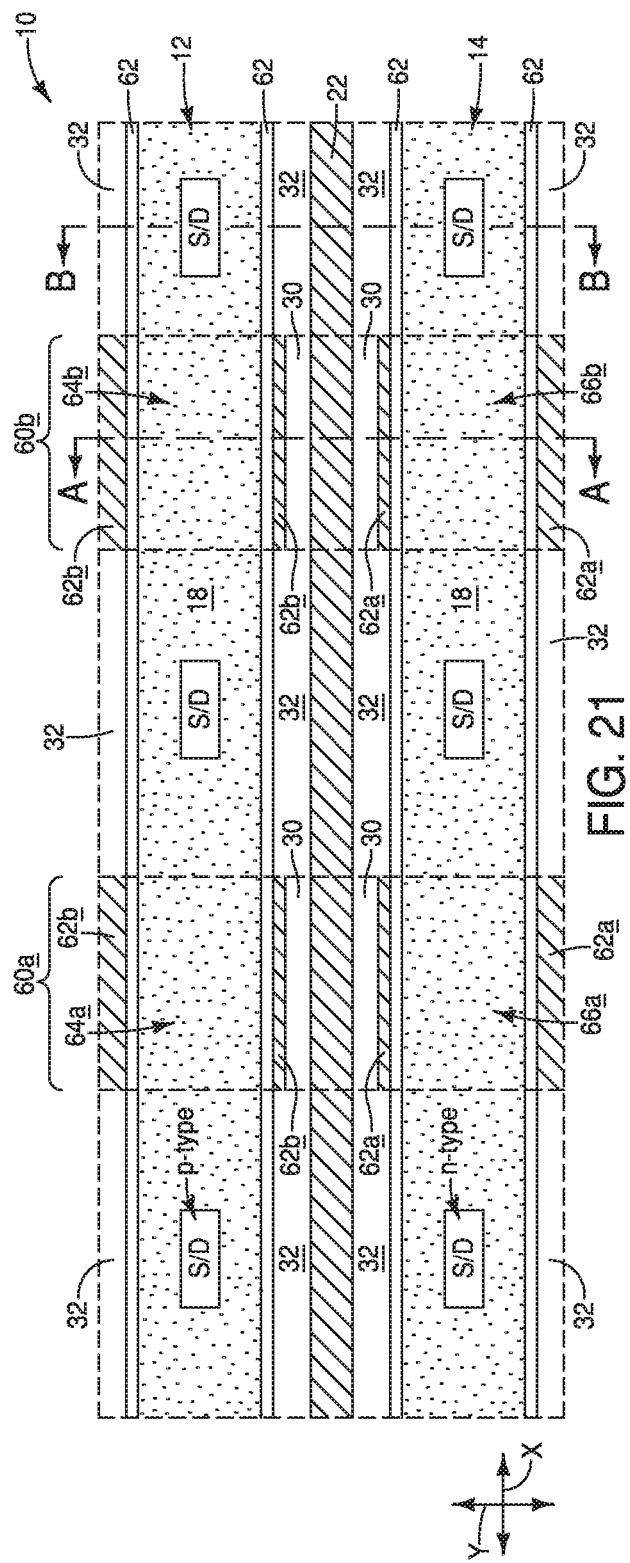
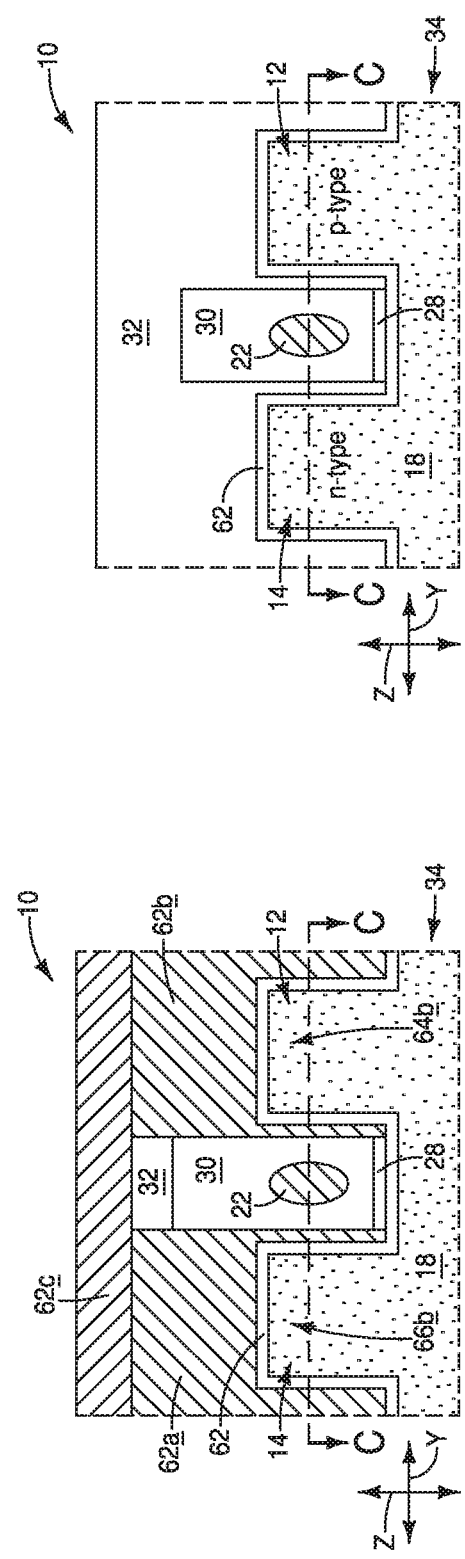
FIG. 21
FIG. 21A
FIG. 21B

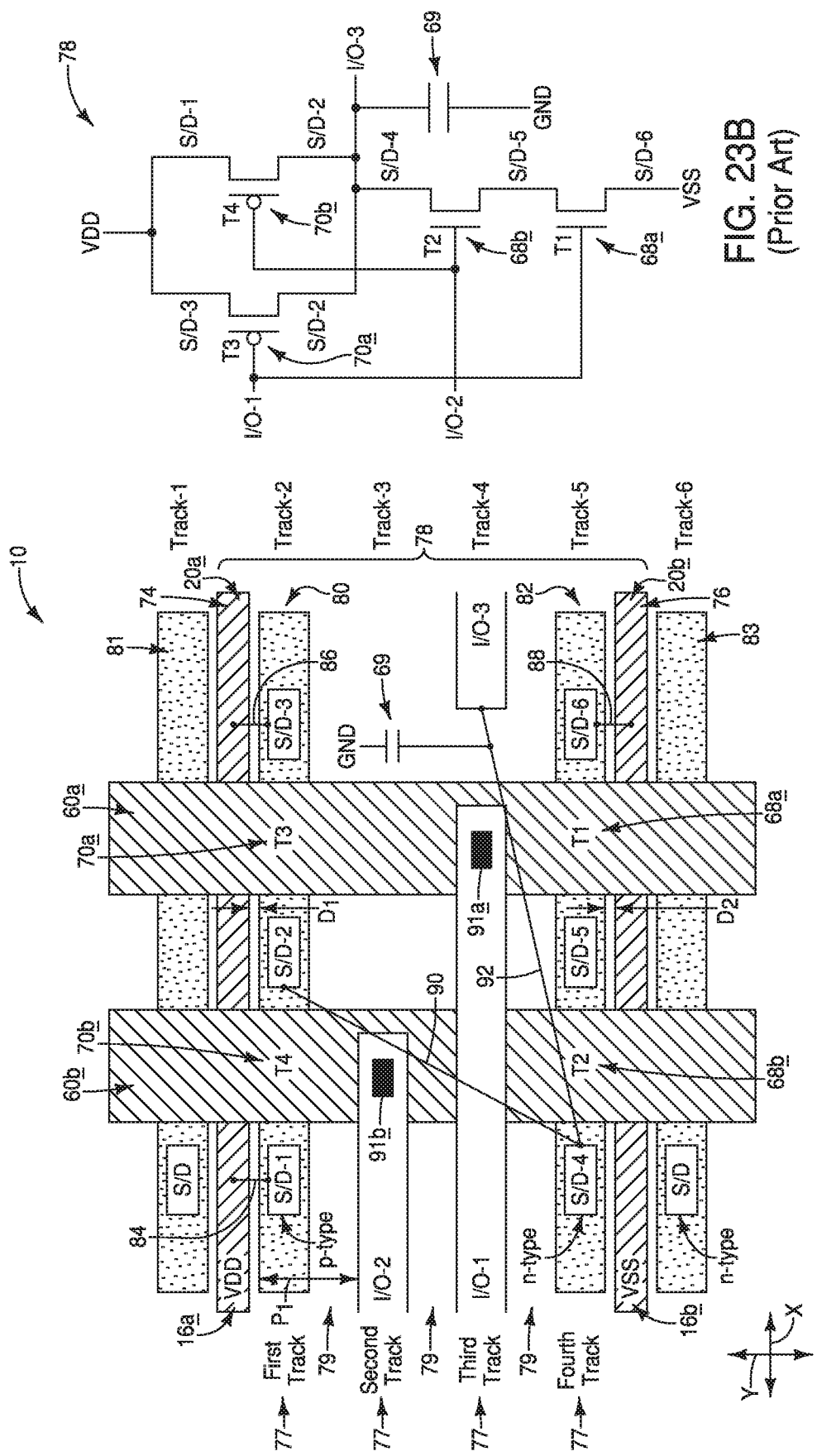

US 11,600,707 B2

METHODS OF FORMING CONDUCTIVE PIPES BETWEEN NEIGHBORING FEATURES, AND INTEGRATED ASSEMBLIES HAVING CONDUCTIVE PIPES BETWEEN NEIGHBORING FEATURES

TECHNICAL FIELD

Integrated assemblies and methods of forming integrated assemblies. Methods of forming conductive pipes between neighboring features. Integrated assemblies having conductive pipes between neighboring features.

BACKGROUND

Patterned features are commonly utilized in integrated assemblies. In some example applications, the patterned features may be conductive features utilized as interconnects, and/or utilized to bring suitable voltage (e.g., VDD, VSS, etc.) to integrated circuitry. It is becoming increasing difficult to fabricate patterned features with increasing levels of integration due to the tight spacings available for the patterned features. It would be desirable to develop new methods for forming patterned features and to develop new architectures utilizing the patterned features.

BRIEF DESCRIPTION OF THE DRAWINGS

FIGS. 1-1B are views of a region of an example integrated assembly. FIG. 1 is a diagrammatic top-down view along the cross-section 1-1 of FIGS. 1A and 1B. FIGS. 1A and 1B are diagrammatic cross-sectional side views along the lines A-A and B-B, respectively, of FIG. 1.

FIGS. 2-5 are views of a region of an example integrated assembly at sequential process stages of an example method. FIGS. 2-5 are diagrammatic top-down views. FIGS. 2A-5A are diagrammatic cross-sectional side views along the lines A-A of FIGS. 2-5, respectively.

FIG. 6 is a diagrammatic cross-sectional side view of a region of an example integrated assembly.

FIGS. 7-9 are diagrammatic cross-sectional side views of a region of an example integrated assembly at sequential process stages of an example method.

FIGS. 10-13 are views of a region of an example integrated assembly at sequential process stages of an example method. FIGS. 10-13 are diagrammatic top-down views. FIGS. 10A-13A are diagrammatic cross-sectional side views along the lines A-A of FIGS. 10-13, respectively. FIGS. 10B-12B are diagrammatic cross-sectional side views along the lines B-B of FIGS. 10-12, respectively.

FIGS. 14-16 are diagrammatic top-down views of a region of an example integrated assembly at sequential process stages of an example method.

FIGS. 21-21B are views of a region of an example integrated assembly. FIG. 21 is a diagrammatic cross-sectional top-down view along the lines C-C of FIGS. 21A and 21B. FIGS. 21A and 21B are diagrammatic cross-sectional side views along the lines A-A and B-B, respectively, of FIG. 21.

FIG. 23A is a diagrammatic top-down view of a region of an example embodiment integrated circuit which may comprise the prior art arrangement of FIG. 22B.

FIG. 23B is a duplicate of the schematic diagram of FIG. 22B.

DETAILED DESCRIPTION OF THE ILLUSTRATED EMBODIMENTS

Figure 9:
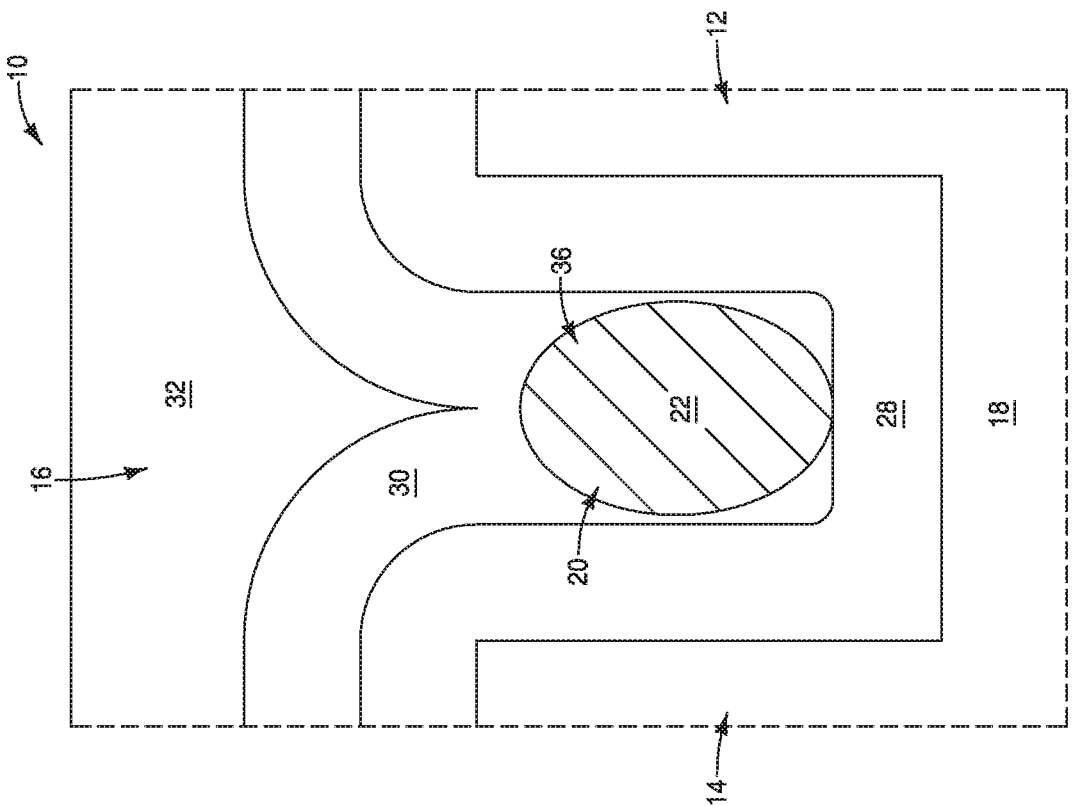

Some embodiments include methods of forming conductive pipes (linear structures) between features of an integrated assembly. Some embodiments include integrated assemblies comprising conductive pipes. Some embodiments include logic circuits (e.g., 2NFET, 2PFET circuits; where NFET refers to a field effect transistor with n-type source/drain regions and PFET refers to a field effect transistor with p-type source/drain regions). Example embodiments are described with reference to FIGS. 1-25.

Referring to FIGS. 1-1B, an integrated assembly 10 includes a pair of features 12 and 14. The features are shown to be linear structures, with such linear structures extending along a first direction corresponding to an illustrated x-axis direction. The linear features may be straight (as shown), wavy, curved, etc., and are substantially parallel to one another. The term "substantially parallel" means parallel to within reasonable tolerances of fabrication and measurement.

The features 12 and 14 may be supported by an underlying semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

The features 12 and 14 are spaced from one another by an intervening space 16. In the illustrated embodiment, the space 16 has about a same width W along an illustrated y-axis as the features 12 and 14. Accordingly, the features 12 and 14 may be considered to be formed along (on) a pitch P with the width of the space 16 being about ½ P.

The features 12 and 14 comprise a material 18. The material 18 may comprise any suitable composition(s). Although the material 18 shown to be homogeneous, in other embodiments the material 18 may be heterogeneous and may comprise two or more discrete compositions. Further, although the features 12 and 14 are shown comprising the same material 18 as one another, in other embodiments the features may comprise different compositions relative to one another.

The material 18 may be conductive, insulative, semiconductive, etc. If the material 18 includes two or more discrete compositions, such compositions may have different conductivities relative to one another. For instance, in some embodiments one of the compositions may be conductive while another is insulative, etc.

A conductive pipe (structure, feature, line, etc.) 20 is within the space 16. The conductive pipe 20 is shown in dashed-line (phantom) view in FIG. 1 to indicate that it is beneath other materials.

The conductive pipe comprises a conductive material 22. The conductive material 22 may comprise any suitable electrically conductive composition(s); such as, for example, one or more of various metals (e.g., titanium, tungsten, tantalum, cobalt, molybdenum, nickel, platinum, ruthenium, copper, aluminum, palladium, silver, gold, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 22 may comprise, consist essentially of, or consist of one or more of metal nitride, metal carbide, metal silicide and metal boride. In some embodiments, the conductive material 22 may comprise a tungsten core which is laterally surrounded by a layer comprising titanium nitride.

The conductive pipe 20 is substantially parallel to the features 12 and 14, and in the shown embodiment is about halfway between the features 12 and 14 within the intervening space 16.

A first conductive post (block, structure, etc.) 24 is along one side of the pipe 20, and a second conductive post (block, structure, etc.) 26 is along an opposing second side of the pipe 20. The posts 20 and 24 comprise the same composition 22 as the pipe 20.

A first dielectric material 28 is within the intervening space 16, under the conductive pipe 20, and along sidewalls of the features 12 and 14. The first dielectric material 28 may comprise any suitable composition(s), and in some embodiments may comprise, consist essentially of, or consist of one or more of silicon nitride, silicon dioxide, aluminum oxide, hafnium oxide, tantalum oxide, etc.

A second dielectric material 30 is within the intervening space 16, and is over the first dielectric material 28. The second dielectric material 30 is over and under the conductive pipe 20, and in the shown embodiment is also along sidewalls of the conductive pipe 20. The second dielectric material 30 may be less dense than the first dielectric material 28. The second dielectric material 30 may comprise any suitable composition(s), and in some embodiments may comprise, consist essentially of, or consist of one or more of silicon nitride, silicon dioxide, porous silicon dioxide, carbon-doped silicon oxide, boron-doped silicon dioxide, silicon oxynitride, etc.

In some embodiments, the first and second dielectric materials 28 and 30 may both comprise silicon nitride, with the second dielectric material 30 being less dense than the first dielectric material. In some embodiments, the first and second dielectric materials 28 and 30 may both comprise silicon dioxide, with the second dielectric material being less dense than the first dielectric material. In some embodiments, the first dielectric material 28 may comprise silicon nitride, and the second dielectric material 30 may comprise silicon dioxide. In some embodiments, the first dielectric material 28 may comprise silicon nitride, and the second dielectric material 30 may comprise silicon oxynitride.

A third dielectric material 32 is over the second dielectric material 30. The third dielectric material may be denser than the second dielectric material 30, and may comprise any of the compositions described above as being suitable for the first dielectric material 28. The first and third dielectric materials 28 and 32 may comprise a same composition as one another, or may comprise different compositions relative to one another.

In the shown embodiment, a planarized surface 33 extends across the second and third dielectric materials 30 and 32. The planarized surface 33 is spaced from upper surfaces 17 of the features 12 and 14 by at least the second dielectric material 30, and in the shown embodiment is spaced from such surfaces by both the second dielectric material 30 and the first dielectric material 28.

An advantage of the configuration of FIGS. 1-1B is that the features 12 and 14 may be formed on a very tight pitch P (e.g., a pitch corresponding to the minimum pitch achievable by a fabrication process), and the pipe 20 may be formed within the space between such features. Accordingly, the conductive pipe 20 may be packed into tight spaces of an integrated assembly and may provide a conductive interconnect within such tight spaces.

The assembly of FIGS. 1-1B may be formed with any suitable processing. Example processing is described with reference to FIGS. 2-5.

Referring to FIGS. 2 and 2A, the assembly 10 is shown to comprise the features 12 and 14 as fins extending upwardly from a pillar 34 of material 18. In some embodiments, the material 18 of FIGS. 2 and 2A may be semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 18 of FIGS. 2 and 2A may comprise, consist essentially of, or consist of silicon. The silicon may be in any suitable crystalline form (e.g., monocrystalline, polycrystalline, amorphous, etc.).

The fins 12 and 14 may be referred to as a first fin and a second fin, respectively. The fins may have regions of any suitable conductivity type in embodiments in which the material 18 is semiconductor material. For instance, in some embodiments the fins 12 and 14 may comprise regions which are p-type (e.g., may comprise regions having silicon which is conductively doped with boron), and/or may comprise regions which are n-type (e.g., may comprise regions having silicon which is conductively doped with one or both of phosphorus and arsenic). In some embodiments, the fin 12 may include first regions having a first conductivity type and the fin 14 may comprise second regions having a second conductivity type, with the second conductivity type being different than the first conductivity type (e.g., one of the first and second conductivity types may be p-type while the other is n-type).

The fins 12 and 14 (i.e., the first and second features 12 and 14) are spaced from one another by the intervening space 16, and extend substantially parallel to one another along the illustrated x-axis direction.

Referring to FIGS. 3 and 3A, the dielectric material 28 is formed within the intervening space 16. In the illustrated embodiment, the dielectric material 28 extends conformally along outer surfaces of the features 12 and 14, and narrows the intervening space 16. The dielectric material 28 may be referred to as a first dielectric material.

The second dielectric material 30 is formed over the first dielectric material 28, and within the space 16 narrowed by the first dielectric material. The second dielectric material 30 may have a lower density than the first dielectric material 28, and accordingly a void 36 may be generated within the material 30 during the deposition of the material 30. Specifically, a top region 37 of the second material 30 may pinch off at a top of the intervening space 16 to preclude the material 30 from completely filling the space, and to thereby create the void 36.

In the illustrated embodiment, the void 36 corresponds to a tube (as shown relative to the top-down view of FIG. 3), with such tube extending substantially parallel to the first and second features 12 and 14. The tube 36, and the features 12 and 14, are shown in dashed-line view in FIG. 3 to indicate that the tube and the features are beneath other materials.

The tube 36 has a first end 39 and an opposing second end 41.

A third dielectric material 32 is formed over the second dielectric material 30. The third dielectric material 32 may be denser than the second dielectric material 30. In some embodiments, the third dielectric material 32 may be tailored to effectively seal the void within the second dielectric material 30. For instance, the third dielectric material 32 may be provided to have high conformality so that it may effectively seal the void 32 in the second dielectric material 30 to the extent that additional sealing is needed or desired.

In some embodiments, the dielectric materials 28, 30 and 32 may all comprise a same composition (e.g., silicon dioxide or silicon nitride), but the deposition conditions may be varied so that the middle dielectric material 30 has a lower density than the upper and lower dielectric materials 28 and 32. In some embodiments, the middle dielectric material 30 may comprise a different composition than the upper and lower dielectric materials 28 and 32. For instance, the upper and lower dielectric materials 28 and 32 may both comprise silicon nitride while the middle dielectric material comprises silicon dioxide. Alternatively, the upper and lower dielectric materials 28 and 32 may both comprise silicon dioxide while the middle dielectric material comprises silicon nitride. As another example, the upper and lower dielectric materials 28 and 32 may both comprise silicon nitride while the middle dielectric material 30 comprises silicon oxynitride.

In some embodiments, the density of the middle dielectric material 30 may be influenced by incorporating one or more dopants (and/or other additives) into the material. For instance, the middle dielectric material 30 may comprise carbon-doped silicon dioxide, boron-doped silicon dioxide, etc.

The upper and lower dielectric materials 28 and 32 may comprise a same composition as one another, or may comprise different compositions relative to one another.

The dielectric materials 28, 30 and 32 may be formed with any suitable processing, including, for example, atomic layer deposition (ALD) and/or chemical vapor deposition (CVD), etc.

In some embodiments, one or both of the dielectric materials 28 and 32 may be omitted.

FIG. 3A shows the planarized surface 33 extending across the third dielectric material 32. In other embodiments the planarized surface 33 may be formed to extend across regions of both the third dielectric material 32 and the second dielectric material 30, as shown in FIG. 1A.

Referring to FIGS. 4 and 4A, openings 38 are formed along the ends 39 and 41 of the tube 36. The openings may be utilized to allow access to the ends 39 and 41 of the tube 36. Although openings are shown being formed along both of the opposing ends 39 and 41 of the tube 36, in other embodiments an opening be formed only along one of the ends of the tube.

Referring to FIGS. 5 and 5A, the conductive material 22 is formed within the openings 38, and is flowed through such openings into the tube 36. In the illustrated embodiment, the conductive material 22 fills the tube 36 to form the conductive pipe 20 described above with reference to FIGS. 1-1B. The material 22 may comprise any of the compositions described above with reference to FIGS. 1-1B. The material 22 may be formed with any suitable processing, including, for example, one or more of ALD, CVD and physical vapor deposition (PVD).

In some embodiments, the material 22 may comprise one or more metals and/or metal-containing compositions. For instance, in some embodiments the material 22 may comprise a liner of metal nitride (e.g., titanium nitride, tungsten nitride, etc.) which lines the tube 36, and may comprise a metal core material within the lined tube. The metal core material may, for example, comprise, consist essentially of, or consist of tungsten, titanium, etc.

In some embodiments, the formation of the conductive material 22 within the tube 36 may be considered to be a method for patterning the conductive pipe 20 within the region 16 between the features 12 and 14. The illustrated conductive pipe 20 is substantially parallel to the first and second features 12 and 14.

Although the dielectric materials 28, 30 and 32 are shown to comprise homogeneous compositions in the embodiments of FIGS. 1-5, in other embodiments one or more of such other materials may comprise a laminate of two or more compositions. For instance, FIG. 6 shows an enlarged view of the space 16 between the features 12 and 14 at a processing stage of similar to that of FIG. 5A in an example embodiment in which the dielectric materials 28 and 30 each comprise laminates of two or more compositions. Specifically, the dielectric material 28 comprises a laminate of the compositions 28a, 28b and 28c, and the dielectric material 30 comprises a laminate of the compositions 30a and 30b. The laminates may comprise abrupt boundaries between adjacent compositions and/or may comprise gradients between adjacent compositions.

An advantage of utilizing laminate configurations for one or more of the dielectric materials may be that such can enable the dielectric materials to be tailored for particular applications. For instance, the laminate configuration of the dielectric material 30 may enable the cross-sectional shape of the void 36 to be tailored for particular applications.

The compositions 28a-c may comprise any of the substances described above as being suitable for the dielectric material 28, and the compositions 30a and 30b may comprise any of the substances described above as being suitable for the dielectric material 30.

Figure 8:
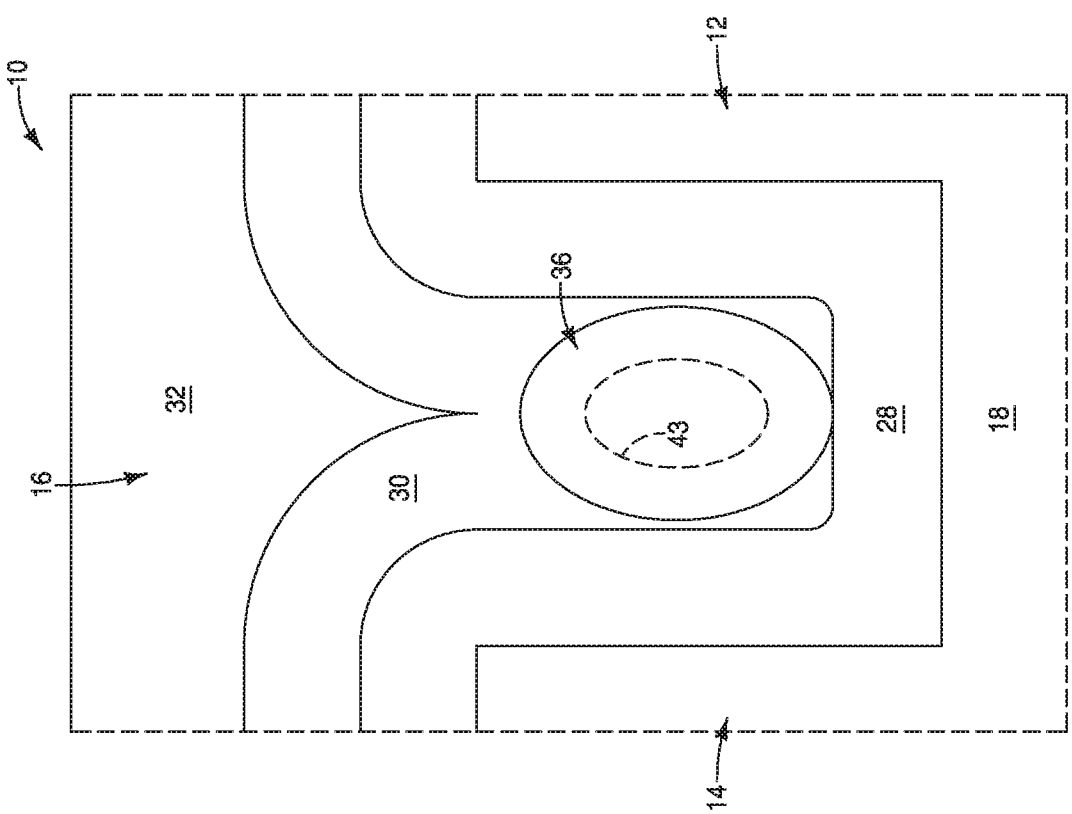

In some embodiments, one or more etchants may be flowed through the openings 38 (FIG. 4) and into the tube 36 to widen the tube prior to formation of the conductive material 22 (FIG. 5) within such tube. For instance, FIG. 7 shows an enlarged view of the space 16 between the features 12 and 14 at the processing stage of FIGS. 4 and 4A. FIG. 8 shows a processing stage subsequent to that of FIG. 7, and shows the tube 36 widened with one or more etchants flowed into the tube through the openings 38 (FIG. 4). If the dielectric material 30 comprises silicon dioxide, the etchant(s) may include hydrochloric acid. If the dielectric material 30 comprises silicon nitride, the etchant(s) may include phosphoric acid.

The original location of the tube 36 is shown with a dashed line 43 in FIG. 8 so that the reader may readily understand that the tube 36 has been widened at the processing stage of FIG. 8 relative to that of FIG. 7.

Referring to FIG. 9, the conductive material 22 is formed within the widened tube 36 to form a conductive pipe 20 of the type described above with reference to FIG. 5.

The embodiment of FIGS. 2-5 shows the dielectric materials 28, 30 and 32 formed along the entire length of the space 16 between the features 12 and 14. In other embodiments, the dielectric materials may be formed only along segments of such space so that the resulting tube 36 extends only along segments of the space, rather than extending the full length of the space. An example of such other embodiments is described with reference to FIGS. 10-13.

Referring to FIGS. 10-10B, the assembly 10 is shown at a process stage similar to that of FIGS. 3 and 3A, except that the space 16 between the features 12 and 14 is subdivided amongst three segments 44, 46 and 48. The segments 44 and 48 comprise the dielectric materials 28, 30 and 32 described above with reference to FIGS. 3 and 3A.

The segment 46 comprises dielectric materials 40 and 42. The dielectric materials 40 and 42 may comprise any suitable composition(s). In some embodiments, the dielectric material 40 may be identical to the dielectric material 28, and the dielectric material 42 may be identical to the dielectric material 32. In some embodiments, the dielectric materials 40 and 42 may be replaced with a single dielectric material.

The less-dense (soft) material 30 is omitted from the segment 46, and accordingly the void 36 does not formed along the segment 46. The configuration of FIG. 10 may be considered to have the segments 44 and 48 corresponding to first regions 50 of the intervening space 16, and to have the segment 46 corresponding to a second region 52 of the intervening space. Tubes 36 extend across the first regions 50 of the intervening space 16, and do not extend across the second region 52 of the intervening space. In some items, the tube 36 within the segment 44 of the intervening space 16 may be referred to as a first tube 51, and the tube within the third segment 48 may be referred to as a second tube 53.

Referring to FIGS. 11-11B, the openings 38 are formed with processing analogous to that described above with reference to FIGS. 4 and 4A.

Referring to FIGS. 12-12B, the conductive material 22 is formed within the openings 38 and the tubes 51 and 53 with processing analogous to that described above with reference to FIGS. 5 and 5A.

The conductive material 22 within the tube 51 forms a first conductive pipe 20a, and the conductive material 22 within the tube 53 forms a second conductive pipe 20b.

The conductive material 22 within the openings 38 forms blocks (posts) 24 and 26 of the type described above with reference to FIG. 1.

In some embodiments, the features 12 and 14 may be considered to extend a first distance $D_1$ along the x-axis direction, and the pipes 20a and 20b may each be considered to extend a second distance $D_2$ along the x-axis direction; with the second distance being less than the first distance. In the illustrated embodiment, the second distance $D_2$ is less than one-half of the first distance $D_2$. In the shown embodiment, the pipes 20a and 20b extend about the same distance as one another (i.e., are about the same length as one another). In other embodiments the pipe 20a may be a different length than the pipe 20b.

In the illustrated embodiment, the first and second conductive pipes 20a and 20b are spaced from one another by an intervening gap corresponding to the segment 46. The intervening gap 46 may be considered to be an insulative region 46 between the first and second conductive pipes 20a and 20b. The pipe 20a may be considered to have a first terminal end 55a on one side of the insulative region 46, and the pipe 20b may be considered to have a second terminal end 55b on an opposing second side of the insulative region 46.

Figure 13:
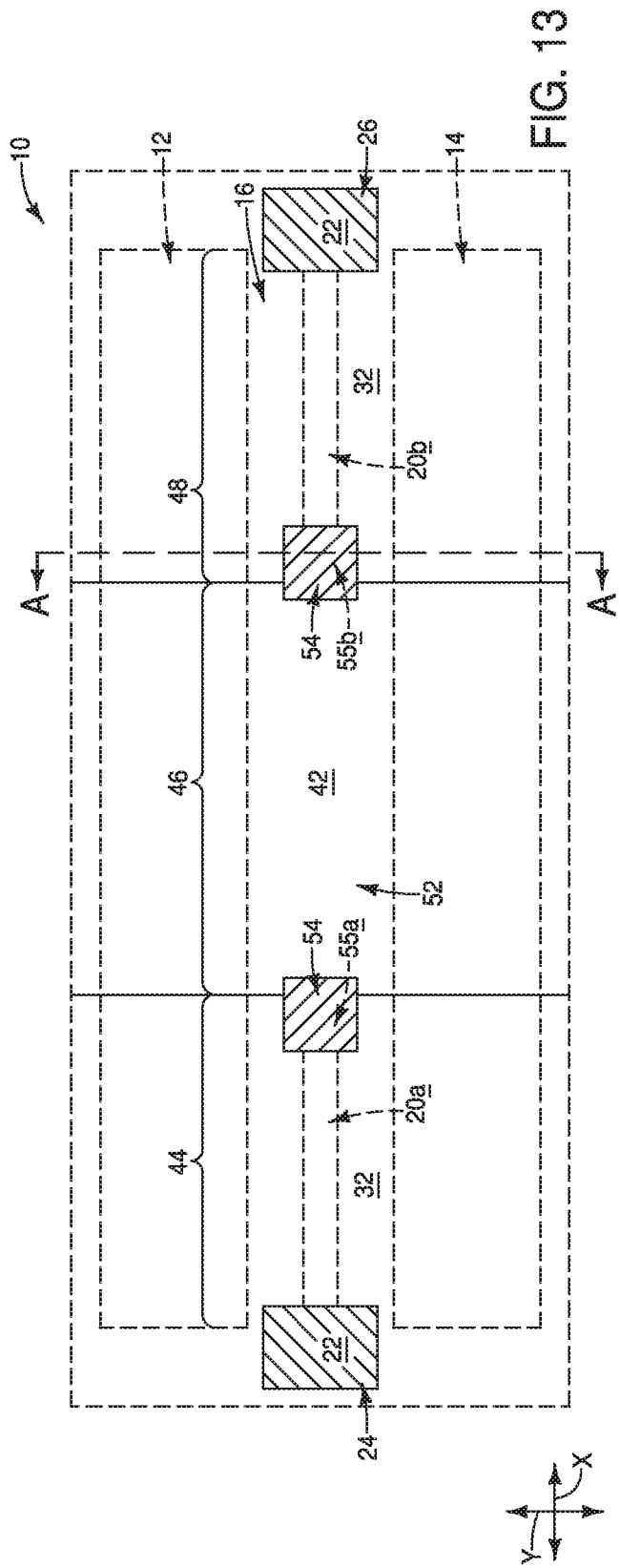
Figure 13A:
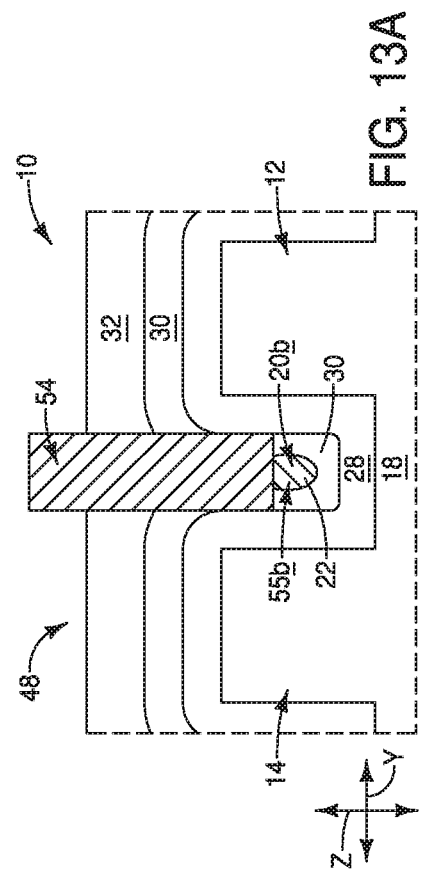

In some embodiments, conductive interconnects may be formed to extend downwardly to one or both of the terminal ends 55a and 55b. For instance, FIGS. 13 and 13A show electrical interconnects 54 extending downwardly through the insulative materials 28, 30 and 32 to be electrically coupled with the terminal ends 55a and 55b of the conductive pipes 20a and 20b.

The electrical interconnects 54 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the electrical interconnects 54 may comprise the conductive material 22 (i.e., the same conductive material as is utilized in the blocks 24 and 26, and as is utilized in the pipes 20a and 20b).

The electrical interconnects 54 may be coupled with other circuitry (not shown). Such other circuitry may be at any suitable elevational level, and in some embodiments may be at an elevational level above the features 12 and 14.

In some embodiments, the features 12 and 14 may be comprised of segments which are spaced by intervening gaps, and it may be desired to form conductive structures which are continuous across such intervening gaps. Methodology described in FIGS. 14-20 may be utilized to fabricate such conductive structures.

Referring to FIG. 14, the construction 10 comprises a configuration in which the feature 12 comprises a pair segments 12a and 12b, and in which the feature 14 comprises a pair of segments 14a and 14b. The segments 12a and 14a are spaced from the segments 12b and 14b by an intervening gap 56.

Referring to FIG. 15, conductive pipes 20a and 20b are formed between the features 12 and 14 with processing analogous to that described above with reference to FIGS. 2-5. Specifically, the conductive pipe 20a is formed between the features 12a and 14a, and the conductive pipe 20b is formed between the features 12b and 14b. The insulative material 32 is shown to extend across the features 12a, 12b, 14a and 14b, and to extend across the pipes 20a and 20b, in a configuration analogous to that of FIGS. 5 and 5A. The pipes 20a and 20b are spaced from one another by the intervening gap 56.

Figure 16:
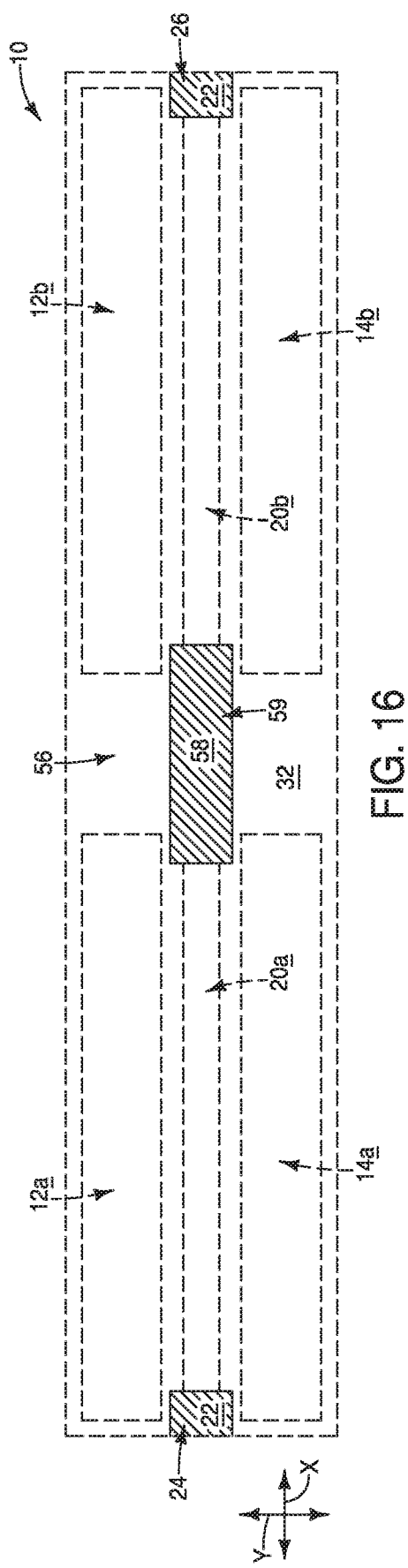

Referring to FIG. 16, conductive material 58 is formed within the intervening gap 56, and is patterned to conductively couple the first conductive pipe 20a to the second conductive pipe 20b. In some embodiments, the conductive material 58 may be considered to be patterned as a feature (structure) 59 which bridges across the gap 56 to electrically couple the first and second conductive pipes 20a and 20b with one another.

The conductive material 58 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the conductive material 58 may comprise a same composition as the conductive material 22, and in other embodiments the conductive material 58 may comprise a different composition than the conductive material 22.

Figure 17:
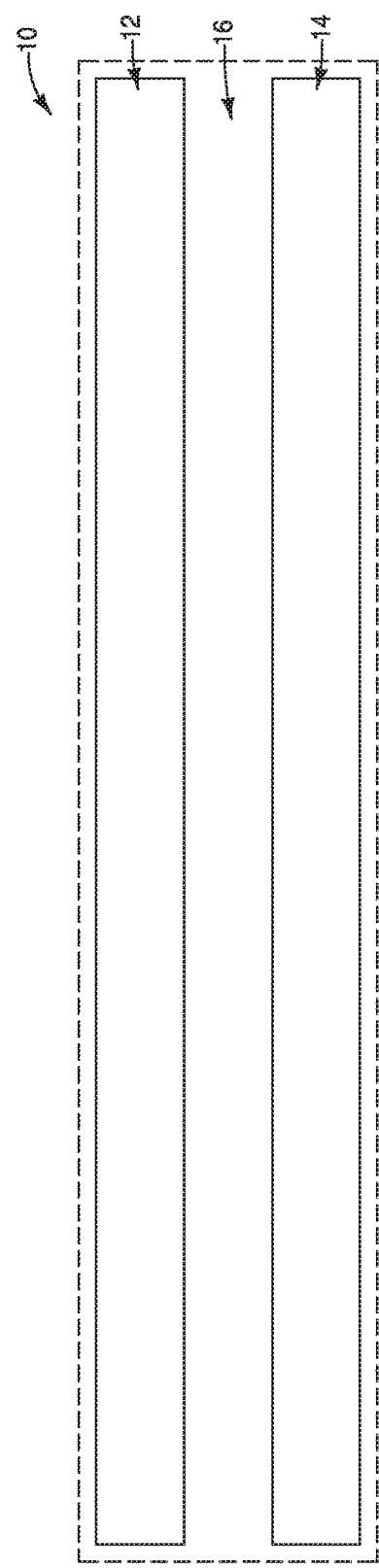
FIGS. 17-20 are diagrammatic top-down views of a region of an example integrated assembly at sequential process stages of an example method.

Referring to FIG. 17, the assembly 10 shown at a process stage analogous to that of FIG. 2, with the features 12 and 14 extending along the x-axis direction.

Figure 18:
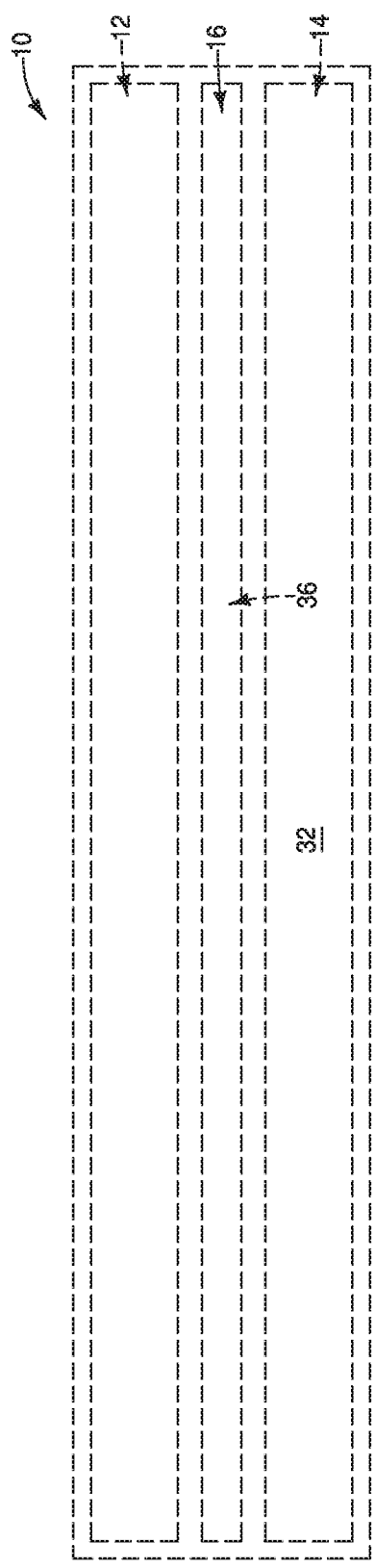

Referring to FIG. 18, the tube 36 is formed with processing analogous to that described above reference to FIGS. 3 and 3A.

Figure 19:
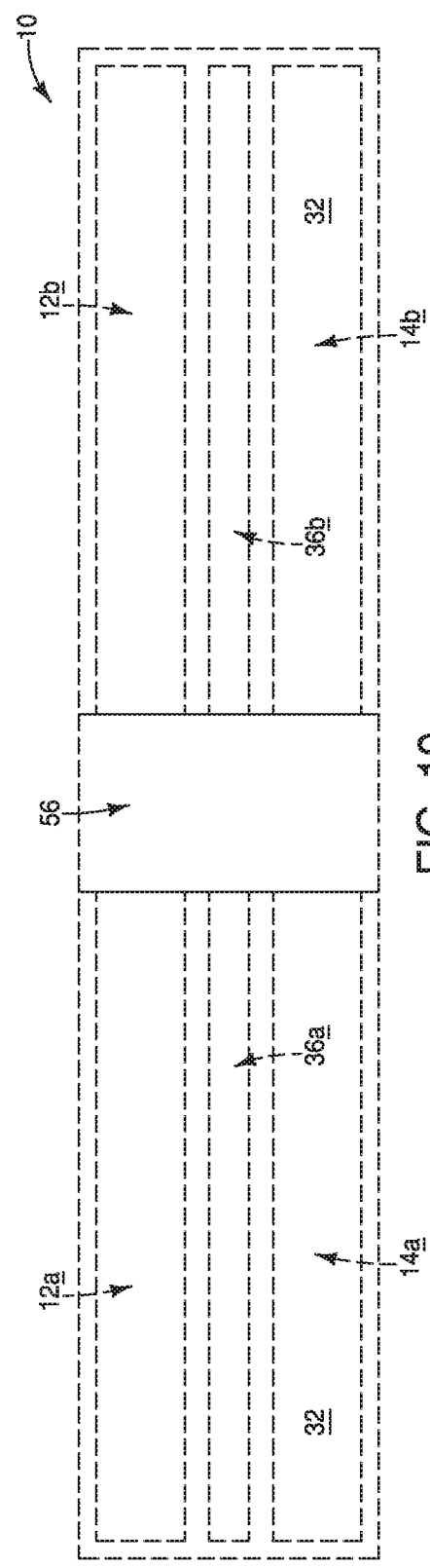

Referring to FIG. 19, a patterned chop subdivides the feature 12 into first and second structures 12a and 12b, subdivides the feature 14 into first and second structures 14a and 14b, and subdivides the tube 36 into first and second structures 36a and 36b. The intervening gap 56 is thus formed to extend between the first structures (12a, 14a and 36a) and the second structures (12b, 14b and 36b).

Figure 20:
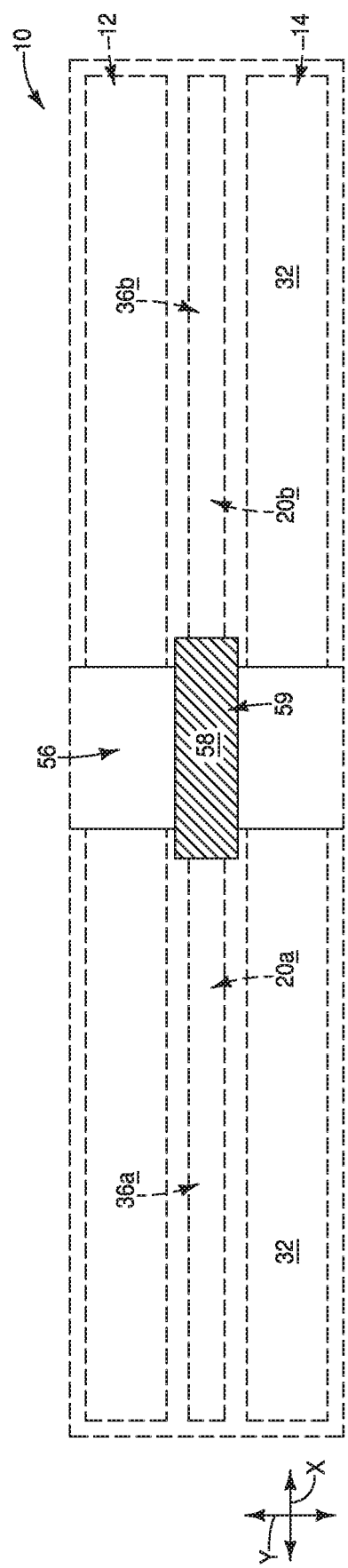

Referring to FIG. 20, the bridging structure 59 is formed to extend across the intervening gap 56, and to couple the first tube 36a with the second tube 36b. The bridging structure 59 comprises the conductive material 58, and such conductive material may be flowed into the tubes 36a and 36b to form the pipes 20a and 20b extending outwardly from the bridging structure 59. In some embodiments, the conductive material 58 comprises both metal nitride (e.g., titanium nitride, tungsten nitride, etc.) and relatively pure metal (e.g., tungsten). The metal nitride may be flowed into the tubes 36a and 36b to line the tubes, and then the relatively pure metal may be flowed into the lined tubes to form a metal core surrounded by the metal nitride liner.

In some embodiments, the structures described above may be incorporated into integrated circuitry as described with reference to FIGS. 21-21B.

The assembly 10 of FIGS. 21-21B includes the features 12 and 14 configured as fins of semiconductor material 18, with such fins extending upwardly from a pillar 34 of the semiconductor material. Stippling is provided within the semiconductor material 18 to assist the reader in identifying the semiconductor material.

The semiconductor material 18 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). For instance, in some embodiments the semiconductor material 18 may comprise, consist essentially of, or consist of silicon. The silicon may be in any suitable crystalline form, and in some embodiments may correspond to monocrystalline silicon.

The fin 12 is shown to include p-type source/drain regions S/D. The p-type regions of the fin 12 may comprise silicon doped with boron to a concentration of at least about $10^{20}$ atoms/cm$^3$.

The fin 14 is shown to include n-type source/drain regions S/D. The n-type regions of the fin 14 may comprise silicon doped with one or both of phosphorus and arsenic to a total concentration of at least about $10^{20}$ atoms/cm$^3$.

The source/drain regions S/D along the first fin 12 may be referred to as first source/drain regions, and the source/drain regions S/D along the second fin 14 may be referred to as second source/drain regions.

Gating structures 60a and 60b extend across the fins 12 and 14, with the gating structures extending along the illustrated y-axis direction. One of the gating structures 60a and 60b may be referred to as a first gating structure, and the other may be referred to as a second gating structure.

The gating structures comprise conductive gating materials 62a-c. The gating materials 62a-c may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, two or more of the gating materials 62a-c may be compositionally the same as one another, and in other embodiments two or more of the gating materials may be compositionally different relative to one another.

Insulative material (gate dielectric material) 62 is along outer surfaces of the fins 12 and 14. The insulative material 62 may comprise any suitable composition(s), and in some embodiments may comprise one or more of silicon dioxide, aluminum oxide, hafnium oxide, zirconium oxide, hafnium oxide, etc.

The fin 12 includes channel regions 64a and 64b between the illustrated source/drain regions S/D along such fin, and the fin 14 includes channel regions 66a and 66b between the illustrated source/drain regions S/D along such fin. The channel regions 64a and 66a are operatively proximate the gating structure 60a, and the channel regions 64b and 66b are operatively proximate the gating structure 60b. The term "operatively proximate" refers to a gating structure in appropriate proximity to a channel region such that an electric field may be selectively induced on the channel region by electrical activation/deactivation of the gating structure. The selective inducement of electric field on the channel region may be utilized achieve controlled coupling/decoupling of source/drains S/D on opposing sides of the channel region.

The channel regions 64 and 66 may be appropriately doped to achieve desired threshold voltages.

Circuitry analogous to that of FIG. 21-21B may be utilized in logic devices.

Figures 22A, 22B:
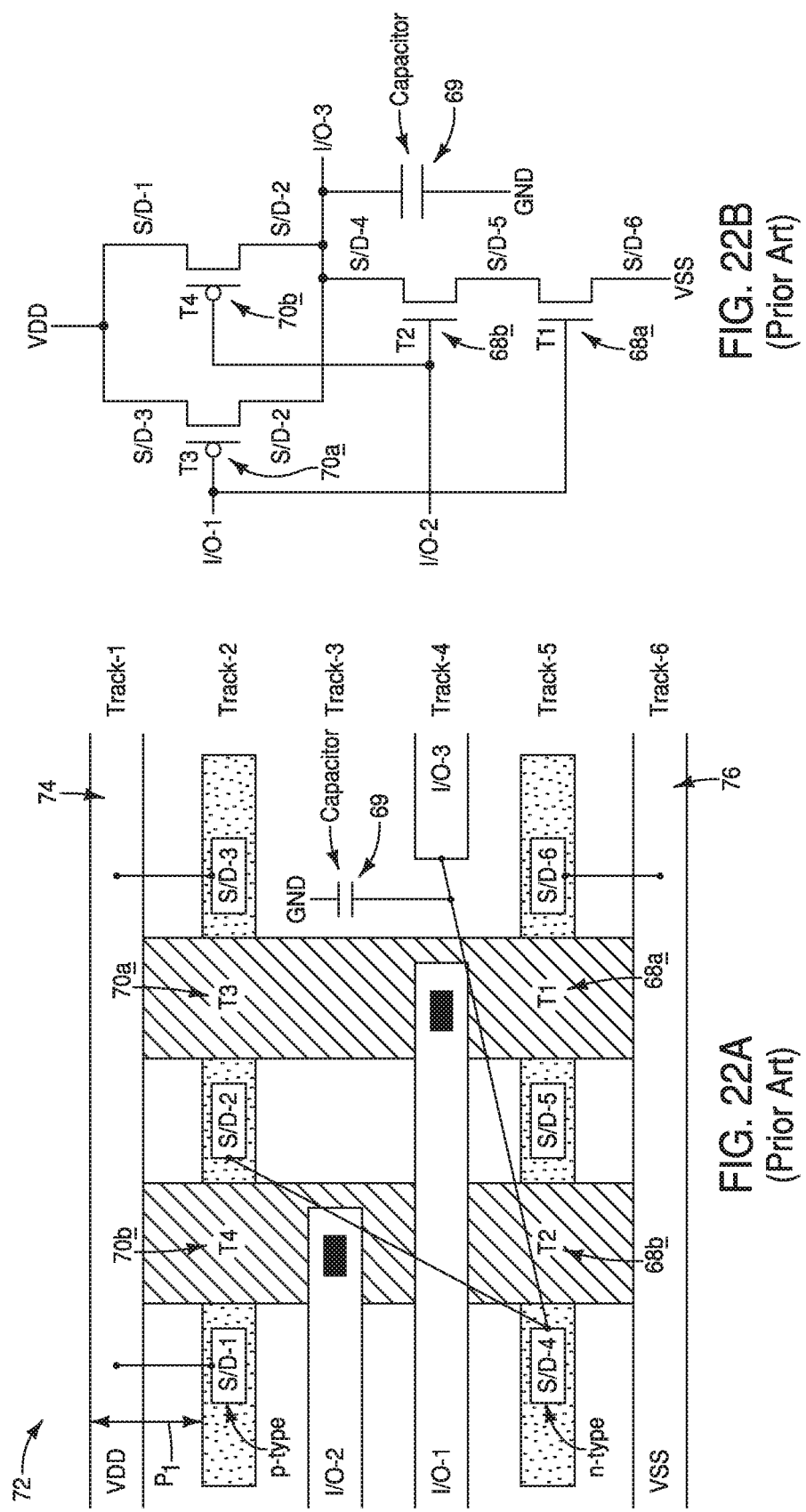
FIG. 22A is a diagrammatic top-down view of a region of an example prior art integrated circuit.
FIG. 22B is a schematic diagram of the example prior art integrated circuit of FIG. 22A.

FIGS. 22A and 22B illustrate an example prior art logic device comprising two NFET devices 68a and 68b (labeled as transistors T1 and T2), and two PFET devices 70a and 70b (labeled as transistors T3 and T4). The illustrated device also includes a capacitor 69.

FIG. 22B is a schematic illustration of the prior art device, and FIG. 22A is a diagrammatic illustration of a region of a semiconductor assembly 72 comprising the device.

The diagrammatic illustration of FIG. 22A shows that the assembly may be considered to comprise six tracks (labeled Tracks 1-6). The tracks are on a pitch $P_1$ which may be a minimum lithographic pitch of a fabrication process. The outer tracks (Track-1 and Track-6) comprise conductive structures (powerlines, wiring lines) 74 and 76 which provide VDD and VSS to the device (i.e., which are coupled with reference nodes at VDD and VSS).

In some embodiments, a logic device analogous to that of FIGS. 22A and 22B may be formed utilizing processing in accordance with one or more of the embodiments of FIGS.

1-21 to achieve a higher degree of integration as compared to the prior art device of FIG. 22A.

FIG. 23A shows an assembly 10 comprising an example logic cell 78 having two NFET transistors 68a and 68b, and two PFET transistors 70a and 70b. The logic cell 78 may be referred to as a two-NFET-two-PFET device.

FIG. 23B schematically illustrates the two-NFET-two-PFET logic cell 78. The schematic illustration of FIG. 23B is identical to that of FIG. 22B.

The six tracks (Tracks 1-6) described above relative to FIG. 22A are shown along the right side of the logic cell 78 of FIG. 23A. However, the logic cell primarily utilizes only four of such six tracks. Accordingly, four tracks 77 are shown along the left side of FIG. 23A, with such four tracks being identified as a First Track, Second Track, Third Track and Fourth Track. The four tracks 77 extend along a first direction which corresponds to an illustrated x-axis direction. The four tracks 77 are spaced from one another by intervening spaces 79. The tracks and spaces (77, 79) alternate with one another along a second direction (the illustrated y-axis direction). The second direction (y-axis direction) is shown to be orthogonal to the first direction (x-axis direction). In some embodiments, the second direction may be substantially orthogonal to the first direction, with the term "substantially orthogonal" meaning orthogonal to within reasonable tolerances of fabrication and measurement.

The tracks 77 and the intervening spaces 79 are on a pitch $P_1$. Such pitch may be a minimum lithographic pitch of a fabrication process.

A first semiconductor-containing feature 80 is along the First Track, and a second semiconductor-containing feature 82 is along the Fourth Track. The first semiconductor-containing feature 80 is paired with an adjacent semiconductor-containing feature 81, and the second semiconductor feature 82 is paired with an adjacent semiconductor-containing feature 83. The features 80-83 may correspond to semiconductor fins analogous to the fins 12 and 14 of FIG. 21. In the illustrated embodiment, the fins 80 and 81 are paired with one another, and a conductive pipe 20a is formed between such fins. Also, the fins 82 and 83 are paired with one another, and a conductive pipe 20b is formed between such fins. The conductive pipes 20a and 20b may be formed with processing analogous to that described above with reference to FIGS. 2-5.

The fins 80 and 81 may be considered to be spaced from one another by a first gap 16a, and the fins 82 and 83 may be considered to be spaced from one another by a second gap 16b. The conductive pipes 20a and 20b are within the first and second gaps, respectively. The conductive pipe 20a is substantially parallel to the fins 80 and 81, and the conductive pipe 20b is substantially parallel to the fins 82 and 83.

In the illustrated embodiment, the fins 80-83 are all formed on the pitch $P_1$, and the conductive pipes 20a and 20b are not on such pitch. Instead, the conductive pipe 20a is spaced from the fin 80 by a first distance $D_1$ which is less than or equal to about one-half of the pitch $P_1$, and the conductive pipe 20b is spaced from the fin 82 by a second distance $D_2$ which is also less than or equal to about one-half of the pitch $P_1$.

In some embodiments, the distances $D_1$ and $D_2$ may be the same as one another, and in other embodiments such distances may be different from one another. In some embodiments, the first and second distances $D_1$ and $D_2$ may be less than or equal to about one-fourth of the pitch $P_1$.

In the illustrated embodiment, the conductive pipe 20a is on an opposite side of the first semiconductor-containing feature 80 from the Second Track, and the conductive pipe 20b is on an opposite side of the semiconductor-containing feature 82 from the Third Track. Accordingly, a pair of outer edges of the logic cell 78 are bounded by the conductive pipes 20a and 20b.

The conductive pipe 20a is shown to be coupled with VDD (i.e., is coupled with a reference voltage node at VDD), and the conductive pipe 20b is shown to be coupled with VSS (i.e., is coupled with a reference voltage node at VSS). In other embodiments, the conductive pipes may be coupled with other suitable supply voltages.

The semiconductor-containing feature 80 is shown to comprise three p-type source/drain regions (S/D-1, S/D-2 and S/D-3), and the semiconductor-containing feature 82 is shown to comprise three n-type source/drain regions (S/D-4, S/D-5 and S/D-6). The regions S/D-1, S/D-2 and S/D-3 may be referred to as first, second and third source/drain regions, and the regions S/D-4, S/D-5 and S/D-6 may be referred to as fourth, fifth and sixth source/drain regions.

First and second gating structures 60a and 60b extend along the second direction (y-axis direction), and cross the tracks 77.

The first and second source/drain regions S/D-1 and S/D-2 are on opposing sides of the second gating structure 60b relative to one another, and the second and third source/drain regions S/D-2 and S/D-3 are on opposing sides of the first gating structure 60a relative to one another. The fourth and fifth source/drain regions S/D-4 and S/D-5 are on opposing sides of the second gating structure 60b relative to one another, and the fifth and sixth source/drain regions S/D-5 and S/D-6 are on opposing sides of the first gating structure 60a relative to one another.

A first electrical connection 84 extends from the first source/drain region S/D-1 to the first conductive pipe 20a, and a second electrical connection 86 extends from the third source/drain region S/D-3 to the first conductive pipe 20a. A third electrical connection 88 extends from the sixth source/drain region S/D-6 to the second conductive pipe 20b. A fourth electrical connection 90 extends from the second source/drain region S/D-2 to the fourth source/drain region S/D-4.

Input/output (I/O) is provided relative to the logic cell 78. In the shown embodiment, a first input/output (I/O-1) has a region (interconnect) which extends along the Third Track, and which is electrically coupled with the first gating structure 60a through an interconnect 91a.

A second input/output (I/O-2) has a region (interconnect) which extends along the Second Track, and which is electrically coupled with the second gating structure 60b through an interconnect 91b.

A third input/output (I/O-3) has a region (interconnect) which extends along the Third Track. A fifth electrical connection 92 extends from the fourth source/drain region (S/D-4) to the interconnect associated with I/O-3.

The terms "first", "second" and "third" input/outputs are arbitrary. For instance, either of the input/outputs I/O-1 and I/O-2 may be referred to as the "first" and "second" input/output.

The electrical connections 84, 86, 88, 90 and 92 may comprise any suitable materials and may be formed at any suitable elevational level(s). In some embodiments, the gating structures 60a and 60b may be at a first elevational level, and the connections 90 and 92 may be at a second level which is above the first level. The electrical connections 84, 86 and 88 may be at the same elevational level as the gating structures 60a and 60b, or may be at a different elevational level relative to such gating structures. The electrical connections 84, 86, 88, 90 and 92 may comprise any suitable electrically conductive materials and may comprise any suitable structural configurations.

The capacitor 69 is shown to be electrically coupled along the connection 92, and thus is electrically coupled with the fourth source/drain region (S/D-4). The capacitor 69 may be formed at any suitable location, and may or may not be formed at the illustrated location. One of the electrodes of the capacitor 69 shown to be coupled with ground voltage (GND); or, in other words, with an electrical node at ground voltage. In other embodiments, the electrode may be coupled with any other suitable voltage.

Figure 24:
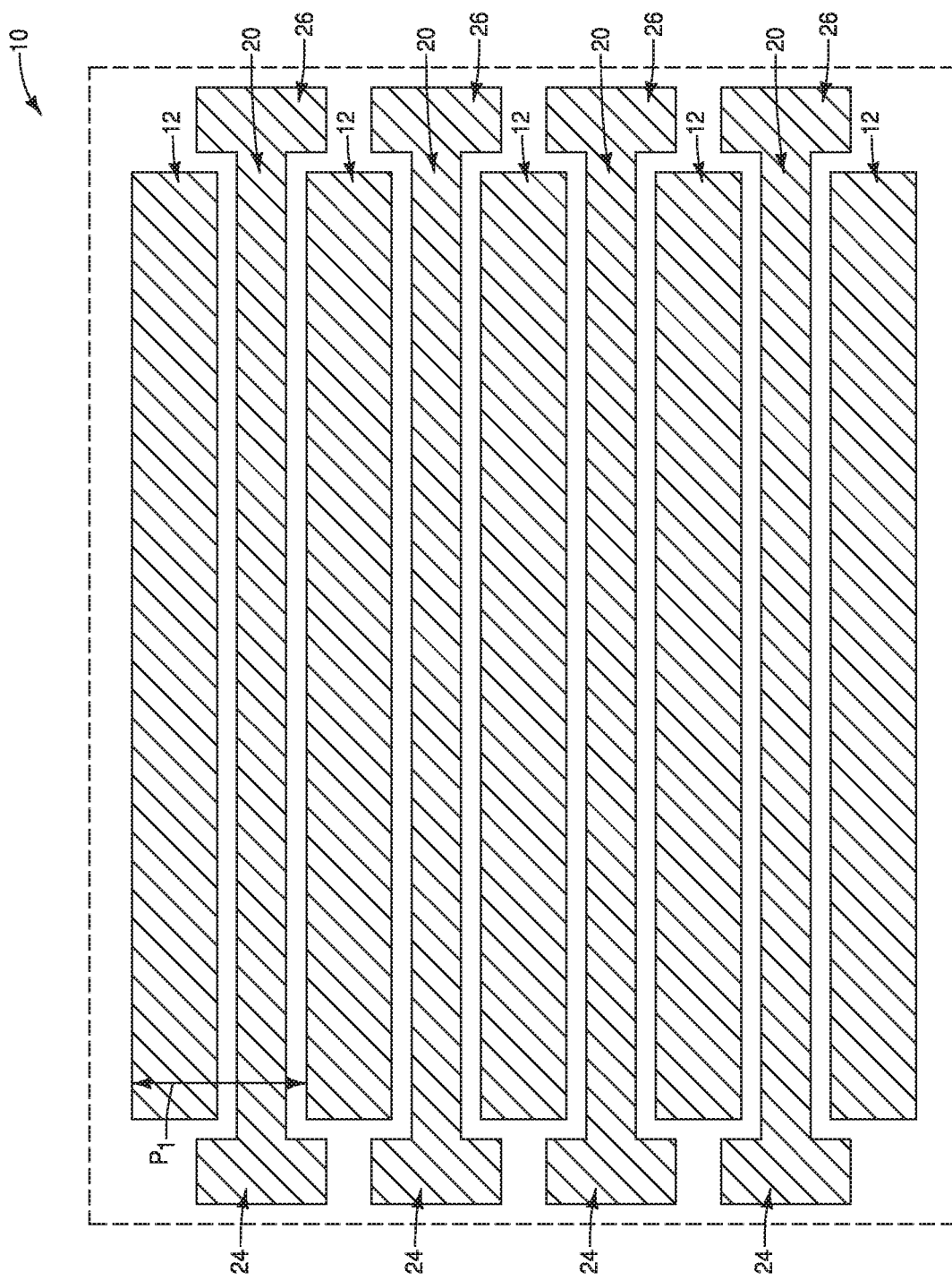
FIG. 24 is a diagrammatic cross-sectional top-down view of an example integrated assembly.

The conductive pipes 20 described herein may be provided in any suitable locations and may be utilized for any suitable applications. For instance, FIG. 24 shows an application in which conductive features 12 are formed along a first pitch $P_1$, and in which the conductive pipes 20 are provided between the features and are utilized to reduce the pitch. Specifically, the features 12 and the pipes 20 may be conductive structures which alternate with one another, which together are formed along a second pitch which is less than the first pitch $P_1$. Conventional processes utilize multiple techniques for reducing pitch. Such techniques are commonly referred to as pitch-multiplication techniques, with example pitch-multiplication techniques being pitch-doubling techniques. The pitch-doubling techniques effectively reduce a pitch between features by about half (i.e., form twice as many features within a defined area of a semiconductor substrate). The methodology described with reference to FIG. 24 may be considered to be an example of utilizing the pipes 20 in a pitch-multiplication technique. The structure of FIG. 24 may be utilized at any suitable level within an integrated circuit. For instance, the structure may be utilized in a memory array, an electrical bus, etc.

Figure 25:
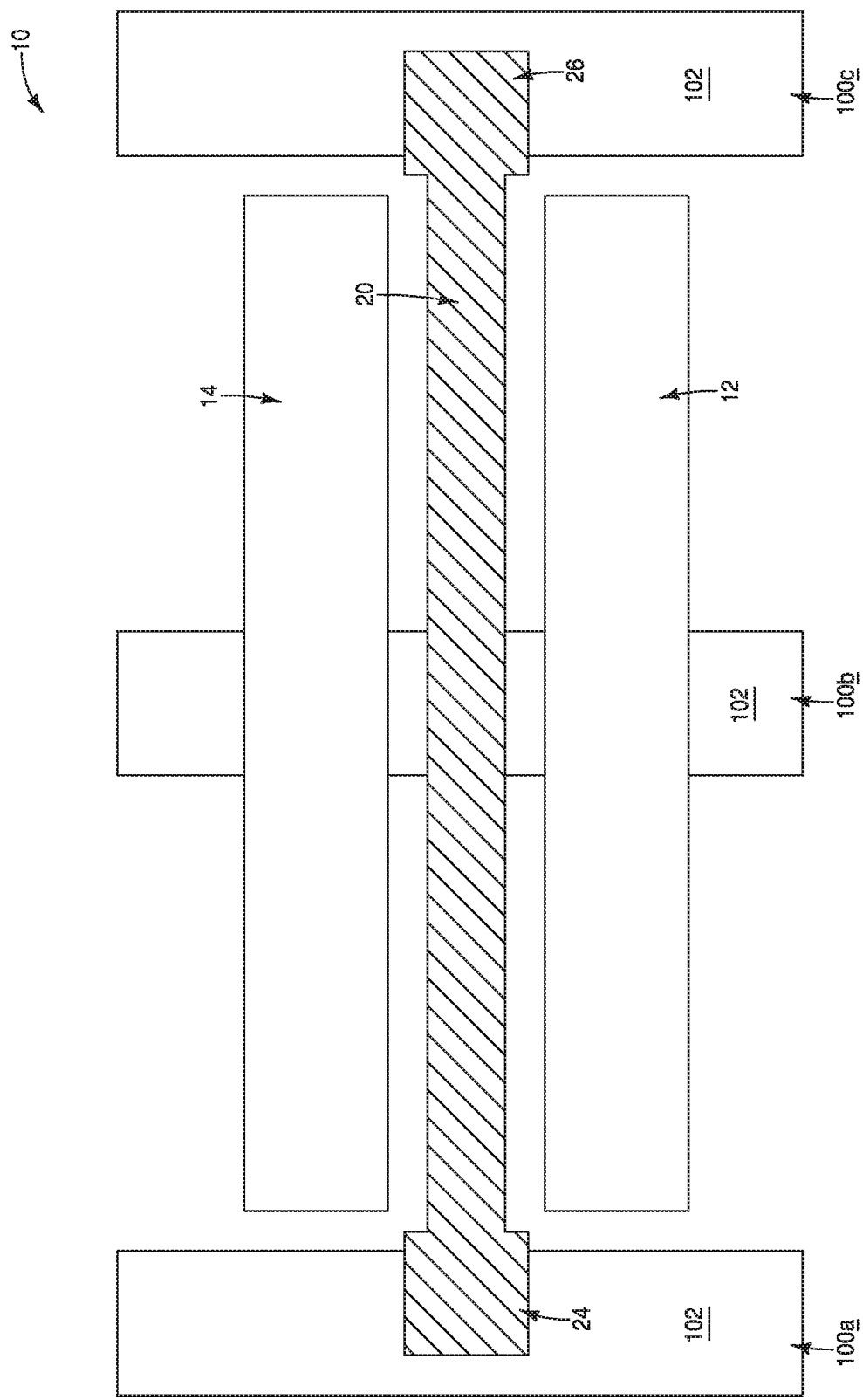
FIG. 25 is a diagrammatic cross-sectional top-down view of an example integrated assembly.

FIG. 25 shows another application of a conductive pipe 20 formed in accordance with embodiments described herein. The illustrated embodiment has the conductive pipe 20 formed between a pair of features 12 and 14. Regions 100*a-c* are under the features 12 and 14, and are under the conductive pipe 20. The regions 100*a-c* may correspond to, for example, active regions across a memory array (i.e., may comprise semiconductor material 102). The illustrated conductive pipe 20 is coupled to the outer regions 100*a* and 100*c* through the conductive blocks 24 and 26, but extends across the inner region 100*b* without being coupled to such region. Specifically, the conductive pipe 20 may be elevationally above the region 100*b*. Accordingly, the pipe 20 may be utilized as an electrical interconnect which extends from the region 100*a* to the region 100*c*, and which passes over the region 100*b* without being electrically coupled to such region. In some embodiments, the regions 100*a* and 100*c* may be referred to as first and second active regions, and the region 100*b* may be referred to as a third active region.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a pair of substantially parallel features spaced from one another by an intervening space. A conductive pipe is between the features and substantially parallel to the features. A first dielectric material is within the intervening space, under the conductive pipe, and along sidewalls of the features. A second dielectric material is within the intervening space and over the first dielectric material. The second dielectric material is over and under the conductive pipe.

Some embodiments include integrated circuitry having first, second, third and fourth tracks which extend along a first direction, and which are spaced from one another by intervening spaces. The tracks and the intervening spaces alternate with one another along a second direction which is substantially orthogonal to the first direction. The tracks and the intervening spaces are on a pitch. A first semiconductor-containing feature is along the first track. A second semiconductor-containing feature is along the fourth track. A first gating structure extends along the second direction and crosses the first, second, third and fourth tracks. A second gating structure extends along the second direction and crosses the first, second, third and fourth tracks. First, second and third source/drain regions are within the first semiconductor-containing feature. The first and second source/drain regions are on opposing sides of the second gating structure relative to one another, and the second and third source/drain regions are on opposing sides of the first gating structure relative to one another. Fourth, fifth and sixth source/drain regions are within the second semiconductor-containing feature. The fourth and fifth source/drain regions are on opposing sides of the second gating structure relative to one another, and the fifth and sixth source/drain regions are on opposing sides of the first gating structure relative to one another. A first conductive pipe is adjacent to the first semiconductor-containing feature and is on an opposite side of the first semiconductor-containing feature from the second track. The first conductive pipe is substantially parallel to the first semiconductor-containing feature and is spaced from the first semiconductor-containing feature by a first distance which is less than about one-half of the pitch. A second conductive pipe is adjacent to the second semiconductor-containing feature and is on an opposite side of the second semiconductor-containing feature from the third track. The second conductive pipe is substantially parallel to the second semiconductor-containing feature and is spaced from the second semiconductor-containing feature by a second distance which is less than about one-half of the pitch. A first electrical connection extends from the first source/drain region to the first conductive pipe. A second electrical connection extends from the third source/drain region to the first conductive pipe. A third electrical connection extends from the sixth source/drain region to the second conductive pipe.

Some embodiments include a method of forming an integrated assembly. First and second features are formed to be spaced from one another by an intervening space. The first and second features are substantially parallel to one another. A dielectric material is formed within the intervening space. The dielectric material pinches off at a top of the intervening space to form a tube which extends substantially parallel to the first and second features. Conductive material is formed within the tube to thereby pattern a conductive pipe within the tube. The conductive pipe is substantially parallel to the first and second features.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a pair of substantially parallel features spaced from one another by an intervening space;
   a conductive pipe between the features and substantially parallel to the features;
   a first dielectric material being within the intervening space, under the conductive pipe, and along sidewalls of the features;
   a second dielectric material within the intervening space and over the first dielectric material; the second dielectric material being over and under the conductive pipe; and
   in a vertical cross section, the intervening space comprising a horizontal width dimension that is about the same as a horizontal width dimension of at least one of the pair of features.

2. The integrated assembly of claim 1 wherein the second dielectric material is along sidewalls of the conductive pipe.

3. The integrated assembly of claim 1 comprising a third dielectric material over the second dielectric material.

4. The integrated assembly of claim 3 wherein the second dielectric material is over the features; and comprising a planarized surface extending across the second and third dielectric materials, with the planarized surface being spaced from upper surfaces of the features by at least the second dielectric material.

5. The integrated assembly of claim 1 wherein the features comprise fins of semiconductor material, the fins being a first fin and a second fin; one of the features of said pair corresponding to the first fin, and the other of the features of said pair corresponding to the second fin.

6. The integrated assembly of claim 5 wherein the first and second fins extend upwardly from a pillar of the semiconductor material.

7. The integrated assembly of claim 5 wherein the semiconductor material comprises silicon.

8. The integrated assembly of claim 5 wherein the semiconductor material comprises monocrystalline silicon.

9. The integrated assembly of claim 1 wherein the features extend a first distance, and wherein the conductive pipe extends a second distance which is less than the first distance.

10. The integrated assembly of claim 1 wherein the a conductive pipe comprises at least one of the following materials: palladium, metal silicide, metal carbide, metal boride, conductively-doped silicon and conductively-doped germanium.

11. The integrated assembly of claim 1 further comprising a conductive post along one side of the conductive pipe.

12. The integrated assembly of claim 11 further comprising another conductive post along a side of the conductive pipe opposite from the one side.

13. The integrated assembly of claim 12 wherein the another conductive post comprises the same composition as the conductive pipe.

14. The integrated assembly of claim 11 wherein the conductive post comprises the same composition as the conductive pipe.

15. The integrated assembly of claim 1 wherein the first dielectric material comprises at least one of the following materials: silicon nitride, silicon dioxide, aluminum oxide, hafnium oxide and tantalum oxide.

16. The integrated assembly of claim 1 wherein the second dielectric material comprises at least one of the following materials: silicon nitride, silicon dioxide, porous silicon dioxide, carbon-doped silicon oxide, boron-doped silicon dioxide and silicon oxynitride.

17. The integrated assembly of claim 1 wherein both of the first and second dielectric materials comprise silicon nitride.

18. The integrated assembly of claim 1 wherein both of the first and second dielectric materials comprise silicon dioxide.

19. The integrated assembly of claim 1 wherein the first dielectric material comprises silicon nitride and the second dielectric material comprises silicon dioxide.

20. The integrated assembly of claim 1 wherein the first dielectric material comprises silicon nitride and the second dielectric material comprises silicon oxynitride.

21. The integrated assembly of claim 1 wherein the conductive pipe comprises a terminal end, the terminal end contacting a separate and discrete structure comprising a conductive post.

22. The integrated assembly of claim 21 wherein the conductive post comprises a rectangular shape.

23. The integrated assembly of claim 21 wherein, in a vertical cross section, the conductive post comprises a greater vertical dimension than the conductive pipe.

24. The integrated assembly of claim 1 wherein, in a vertical cross section, the second dielectric material surrounds and contacts an entirety of a periphery of the conductive pipe.

25. The integrated assembly of claim 1 wherein; in a vertical cross section, the conductive pipe comprising an oval shape.

26. The integrated assembly of claim 1 wherein the horizontal width dimension of the intervening space is about the same as the horizontal width dimensions of each of the pair of features.

27. The integrated assembly of claim 1 wherein the pair of features define a pitch P and the horizontal width dimension of the intervening space comprises a width of about ½ P.

28. An integrated assembly, comprising:
a pair of substantially parallel features spaced from one another by an intervening space;
a conductive pipe between the features and substantially parallel to the features;
a first dielectric material being within the intervening space and directly under the conductive pipe, the first dielectric material against an uppermost surface of the pair of the substantially parallel features; and
a second dielectric material within the intervening space.

29. The integrated assembly of claim 28 wherein the second dielectric material is against an uppermost surface of the first dielectric material.

30. The integrated assembly of claim 28 wherein the conductive pipe comprises a terminal end, the terminal end contacting a separate and discrete structure comprising a conductive post.

31. The integrated assembly of claim 30 wherein the conductive post comprises a rectangular shape.

32. The integrated assembly of claim 30 wherein, in a vertical cross section, the conductive post comprises a greater vertical dimension than the conductive pipe.

33. The integrated assembly of claim 28 wherein, in a vertical cross section, the second dielectric material surrounds and contacts an entirety of a periphery of the conductive pipe.

34. The integrated assembly of claim 28 wherein the conductive pipe comprises an oval shape.

35. The integrated assembly of claim 28 wherein, in a vertical cross section, the first dielectric material is spaced from the conductive tube by only the second dielectric material.

36. The integrated assembly of claim 28 wherein the first dielectric material contacts both of the pair of the substantially parallel features.

37. The integrated assembly of claim 28 wherein the first and second dielectric materials are the only dielectric materials within the intervening space.

38. The integrated assembly of claim 28 wherein the pair of features define a pitch P and a horizontal width dimension of the intervening space comprises a width of about ½ P.

39. The integrated assembly of claim 28 wherein in a vertical cross section, the intervening space comprising a horizontal width dimension that is about the same as a horizontal width dimension of at least one of the pair of features.

40. The integrated assembly of claim 28 wherein the conductive pipe comprises opposite terminal ends and further comprising a conductive post against the terminal ends and comprising separate and discrete structures from the conductive pipe, the conductive post comprising greater dimensions than the conductive pipe.

41. The integrated assembly of claim 28 wherein the features extend a first distance, and wherein the conductive pipe extends a second distance which is less than the first distance.

42. The integrated assembly of claim 28 wherein, in a vertical cross section, the second dielectric material surrounds and contacts an entirety of a periphery of the conductive pipe.

43. An integrated assembly, comprising:
a pair of substantially parallel features spaced from one another by an intervening space;
a conductive pipe between the features and substantially parallel to the features;
a first dielectric material being within the intervening space and extending conformally directly against an uppermost surface and sidewall of the pair of the substantially parallel features;
a second dielectric material within the intervening space; and
wherein, in a vertical cross section, a horizontal width dimension of the intervening space is about the same as a horizontal width dimension of at least one of the pair of features.

44. The integrated assembly of claim 43 wherein the first dielectric material comprises a periphery surface opposite the uppermost surface and the sidewall of the pair of the substantially parallel features, the second dielectric material extending conformally along the periphery surface of the first dielectric material.

45. The integrated assembly of claim 43 wherein the conductive pipe is in the second dielectric material and spaced from the periphery surface of the first dielectric material.

46. The integrated assembly of claim 43 wherein the pair of features define a pitch P and a horizontal width dimension of the intervening space comprises a width of about ½ P.

47. The integrated assembly of claim 43 wherein the conductive pipe comprises opposite terminal ends and further comprising a conductive post against the terminal ends and comprising separate and discrete structures from the conductive pipe, the conductive posts comprising greater dimensions than the conductive pipe.

48. The integrated assembly of claim 43 wherein the features extend a first distance, and wherein the conductive pipe extends a second distance which is less than the first distance.

49. The integrated assembly of claim 43 wherein, in a vertical cross section, the second dielectric material surrounds and contacts an entirety of a periphery of the conductive pipe.

50. An integrated assembly, comprising:
- a pair of substantially parallel features spaced from one another by an intervening space, the pair of features defining a pitch P and the intervening space comprising a width of about ½ P;
- a conductive pipe between the features and substantially parallel to the features;
- a first dielectric material being within the intervening space; and
- a second dielectric material within the intervening space.

51. The integrated assembly of claim 50 wherein, in a vertical cross section, a horizontal width dimension of the intervening space is about the same as a horizontal width dimension of at least one of the pair of features.

52. The integrated assembly of claim 50 wherein the pair of features define a pitch P and a horizontal width dimension of the intervening space comprises a width of about ½ P.

53. The integrated assembly of claim 50 wherein the conductive pipe comprises opposite terminal ends and further comprising a conductive post against the terminal ends and comprising separate and discrete structures from the conductive pipe, the conductive posts comprising greater dimensions than the conductive pipe.

54. The integrated assembly of claim 50 wherein the features extend a first distance, and wherein the conductive pipe extends a second distance which is less than the first distance.

55. The integrated assembly of claim 50 wherein, in a vertical cross section, the second dielectric material surrounds and contacts an entirety of a periphery of the conductive pipe.

56. An integrated assembly, comprising:
- a pair of substantially parallel features spaced from one another by an intervening space;
- a conductive pipe between the features and substantially parallel to the features;
- a first dielectric material being within the intervening space and extending conformally directly against an uppermost surface and sidewall of the pair of the substantially parallel features;
- a second dielectric material within the intervening space; and
- wherein the pair of features define a pitch P and a horizontal width dimension of the intervening space comprises a width of about ½ P.

* * * * *